United States Patent [19]
Kentatsu et al.

[11] Patent Number: 5,559,773
[45] Date of Patent: Sep. 24, 1996

[54] SELF CORRECTING RECORDING REPRODUCING APPARATUS FOR AN OPTICAL CARD

[75] Inventors: Kunihiro Kentatsu, Kyoto; Kazuo Tsuboi; Takeshi Ishida, both of Takatsuki, all of Japan

[73] Assignee: OMRON Corporation, Japan

[21] Appl. No.: 251,033

[22] Filed: May 31, 1994

Related U.S. Application Data

[63] Continuation of Ser. No. 912,575, Aug. 12, 1992, abandoned, which is a continuation of Ser. No. 476,756, Feb. 8, 1990, abandoned.

[30] Foreign Application Priority Data

| Feb. 13, 1989 | [JP] | Japan | 1-33226 |
| Feb. 13, 1989 | [JP] | Japan | 1-33227 |
| Feb. 13, 1989 | [JP] | Japan | 1-33228 |

[51] Int. Cl.[6] .................................................. G11B 7/09
[52] U.S. Cl. ......................................... 369/44.42; 369/44.41
[58] Field of Search .............................. 369/44.41, 44.23, 369/44.11, 112, 109, 110, 44.36, 44.26, 121, 122, 120, 44.42, 44.24; 235/454, 456, 494; 356/376; 250/235

[56] References Cited

U.S. PATENT DOCUMENTS

| 3,522,388 | 7/1970  | Miller .           |          |
|-----------|---------|--------------------|----------|
| 3,966,329 | 6/1976  | Dickey .           |          |
| 4,381,557 | 4/1983  | Jebens             | 369/44.37 |
| 4,514,626 | 4/1985  | Tateoka et al.     | 250/235  |
| 4,550,249 | 10/1985 | Damen et al.       | 369/44.42 |
| 4,562,569 | 12/1985 | Yariv et al.       | 369/122  |
| 4,635,244 | 1/1987  | Gotoh              | 369/121  |
| 4,639,604 | 1/1987  | Murakami et al.    | 250/548  |
| 4,730,293 | 3/1988  | Pierce et al.      | 369/44.42 |
| 4,730,295 | 3/1988  | Bressers           | 369/44.23 |
| 4,731,853 | 5/1988  | Hata et al.        | 356/376  |

(List continued on next page.)

FOREIGN PATENT DOCUMENTS

| 0007660A1 | 9/1979  | European Pat. Off. . |          |
|-----------|---------|----------------------|----------|
| 231380    | 11/1986 | European Pat. Off. . |          |
| 301643    | 2/1989  | European Pat. Off. . |          |
| 0324859A1 | 7/1989  | European Pat. Off. . |          |
| 324859    | 7/1989  | European Pat. Off. . |          |
| 3717604   | 11/1987 | Germany .            |          |
| 0164232   | 7/1987  | Japan                | 369/44.38 |
| 0094438   | 4/1988  | Japan                | 369/44.38 |
| 8700143   | 1/1987  | Netherlands .        |          |
| 8802169   | 3/1988  | WIPO .               |          |
| 8810495   | 12/1988 | WIPO .               |          |

OTHER PUBLICATIONS

Patent Abstracts Of Japan, vol. 10., No. 369 (P–525), 10 Dec. 1986 (JKP–A–61 162840).
Patent Abstracts Of Japan, vol. 11, No. 147 (P–575), 14 May 1987 (JP–A–61 283043).
Patent Abstracts of Japan, vol. 7, No. 109 P–196), 12 May 1983 (JP–A–58 029154).

Primary Examiner—Aristotelis Psitos
Assistant Examiner—Thang V. Tran
Attorney, Agent, or Firm—Dickstein, Shapiro & Morin. L.L.P.

[57] ABSTRACT

An optical card recording/reproducing apparatus for recording/reproducing information onto/from an optical card by relatively moving the optical card to an optical head is provided. The optical head has an optical system for producing focusing and tracking control signals. The optical system includes a light emitting diode having a narrow slit-like light emitting surface as a light source. The optical system has photo sensitive elements for focusing control, a photo sensitive element for tracking control, and a recorded information reproducing photo sensitive element which are used to detect the reflected lights from the optical card of a slit light which is emitted from the light emitting diode. By forming a slit-like light spot onto the optical card, the focusing and tracking controls can be accurately easily executed and the deterioration in pits and track guides is prevented.

5 Claims, 22 Drawing Sheets

U.S. PATENT DOCUMENTS

| | | | |
|---|---|---|---|
| 4,750,162 | 6/1988 | Tajima | 369/44.37 |
| 4,761,776 | 8/1988 | Opheij | 369/54 |
| 4,774,400 | 9/1988 | Kimura | 235/454 |
| 4,787,075 | 11/1988 | Matsuoka et al. | 369/44.38 |
| 4,860,276 | 8/1989 | Ukita | 369/121 |
| 4,881,214 | 11/1989 | Izawa et al. | 369/44.38 |
| 4,888,757 | 12/1989 | Fujita | 369/44.37 |
| 4,924,199 | 5/1990 | Hashimoto et al. | 369/44.11 |
| 4,962,318 | 10/1990 | Nishi | 250/548 |
| 4,980,882 | 12/1990 | Baer et al. | 369/94.26 |
| 5,027,337 | 6/1991 | Takahashi et al. | 369/44.61 |
| 5,027,339 | 6/1991 | Yoda et al. | 369/54 |
| 5,051,569 | 9/1991 | Tsuruoka et al. | 369/275.3 X |
| 5,053,610 | 10/1991 | Horie | 369/44.41 X |
| 5,070,491 | 12/1991 | Horie | 569/44.42 X |
| 5,155,718 | 10/1992 | Hashimoto et al. | 369/44.42 X |
| 5,179,268 | 1/1993 | Nitto et al. | 235/454 |

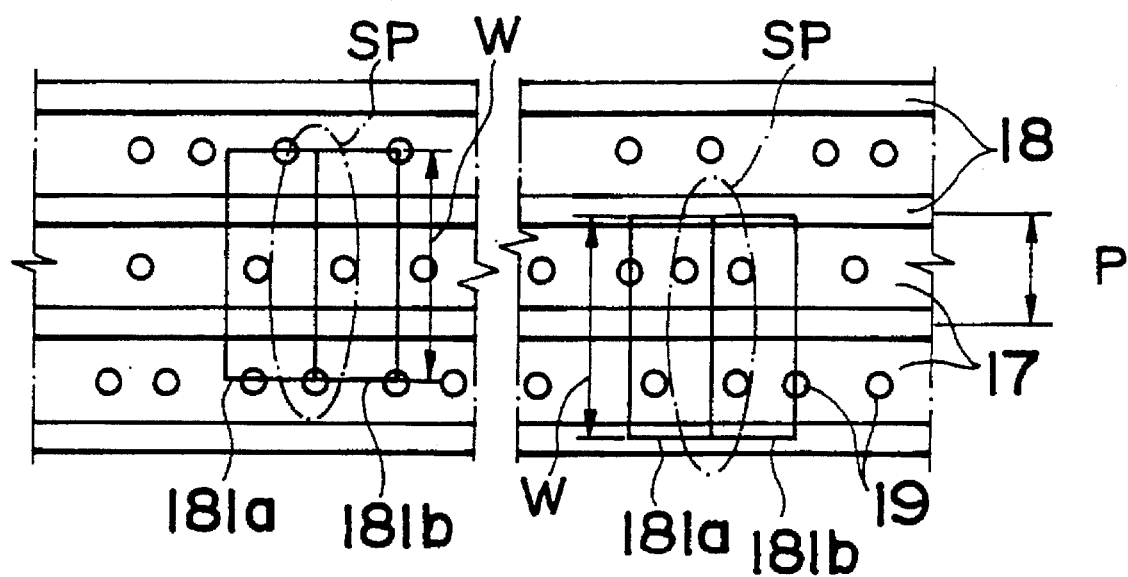

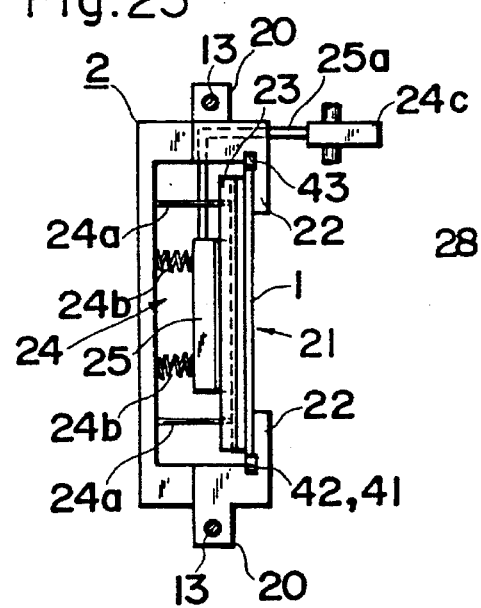
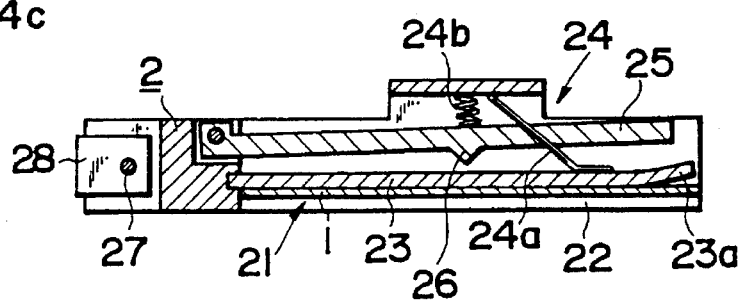

SELF CORRECTING RECORDING REPRODUCING APPARATUS FOR AN OPTICAL CARD

This application is a continuation of application Ser. No. 07/912,575 filed Aug. 12, 1992, now abandoned, which is a continuation of application Ser. No. 07/476,756 filed Feb. 8, 1990, now abandoned.

BACKGROUND OF THE INVENTION

1. Field of the Invention

The present invention relates to a recording/reproducing apparatus of an optical card. In the specification, a recording/reproducing apparatus incorporates: an apparatus for recording (or writing) information or data to an optical card; an apparatus for playing back (or reading) information or data from an optical card; and an apparatus for executing both of the recording and reading operations. On the other hand, an optical card incorporates not only an optical card to/from which information or data can be optically recorded/reproduced but also an optical card to/from which information or data can be magneto optically recorded/reproduced.

2. Description of the Related Art

FIG. 19 shows a whole optical card and an enlarged part thereof.

A number of information recorded or recording tracks 17 which are specified by track guides 18 are provided in an information recording portion 16 of an optical card 1. Bits indicative of information are recorded in a form of pits 19 onto the tracks 17 (in the case of the optically recordable/reproducible card). The track guides 18 are provided for allowing an optical head for recording/reproducing to follow the tracks (what is called a tracking control).

In the optical card in the embodiment, information is optically written/read. In the recording mode, the pits 19 are formed by causing a thermal irreversible change by a light irradiation in the information recording portion 16. On the contrary, in the reproducing mode, the light is irradiated to the pits 19 and regions around them and the reflected lights are received, thereby detecting the presence or absence of the pits. In the case of the embodiment, light reflectances at the pits 19 and track guides 18 are lower than those of the regions around them.

FIGS. 20 to 22 show an example of a mechanical construction of the recording/reproducing apparatus of an optical card. Such a recording/reproducing apparatus has been disclosed in, for instance, U.S. patent application Ser. No. 357,632 (or EP-A2-0 296 590) and U.S. patent application Ser. No. 221,092 (or EP-A2-0 300 481).

In the optical card recording/reproducing apparatus, two guide rods 13 are arranged in parallel in a casing 10 having a card inserting port 11, thereby constructing a guiding mechanism 12. A holder 2 is supported to the guiding mechanism 12 so that it can reciprocate. In correspondence to the portions below a holder moving path, an optical head 6 is arranged on the card inserting side and a card feeding mechanism 5 is arranged on the rear side, respectively.

As shown in FIG. 20, bearings 20 are provided on both sides of the holder 2, thereby supporting the holder 2 to the guide rods 13. A card holding mechanism 21 is provided below the lower surface of the holder 2. A height position of the card holding mechanism 21 is set to a position of the card inserting port 11 of the casing 10.

As shown in FIGS. 22 and 26, the card holding mechanism 21 is constructed in the following manner. Flanges 22 which inwardly project are formed in the lower portions of opposite side walls of the holder 2, thereby supporting both side portions of the optical card 1. A card pressing plate 23 whose both side portions face the flanges 22 is arranged between the side walls of the holder 2. Pressurizing means 24 whose pressing force can be adjusted is provided for the card pressing plate 23. A portion 23a on the card inserting port side of the card pressing plate 23 is slightly bent so as to provide a gap between the portion 23a and the flange 22. On the other hand, an opposite side edge portion of the card pressing plate 23 is loosely inserted into concave portions formed in the holder 2. Guide rollers 41, 42, and 43 are provided on the flanges 22.

The pressurizing means 24 comprises springs 24a and 24b and a lever 25. The springs 24a are arranged between both side portions of the card pressing plate 23 and a part of the holder 2 and generate a relatively weak pressing force. The other springs 24b are arranged between the lever 25 and a part of the holder 2 and generate a pressing force which is stronger than that of the springs 24a. One end of the lever 25 is pivotally supported to the rear side of the holder 2. A pressing projected portion 26 which is come into contact with the central portion of the card pressing plate 23 is formed on the lower surface of the lever 25. In the other edge portion of the lever 25, an arm 25a extends toward the side and passes through a notched portion of the holder 2 and, further, extends downwardly. Through the arm 25a, the lever 25 is pushed up by a cam, a solenoid, or other operating mechanism 24c against the spring force of the springs 24b.

Returning to FIGS. 20 and 21, a sensor 31 and a card loading/ejecting mechanism 3 are arranged on the inside of the card inserting port 11. The sensor 31 detects the inserted optical card 1. In response to the result of the detection of the sensor 31, the card loading/ejecting mechanism 3 automatically loads and ejects out the optical card 1 into/from the card holding mechanism 21 of the holder 2.

The card loading/ejecting mechanism 3 is located below the holder 2. A pair of right and left loading cams 33 are attached to a rotary shaft 32 which is rotatably supported to the casing 10. The rotary shaft 32 is driven by a loading motor 37 through a reducing mechanism comprising a pulley 36a and a belt 36b. The loading cam 33 is an almost semicircular cam made of a rubber material. When a flat cam surface 33a of the loading cam 33 is located horizontally over the rotary shaft 32, the cam surface 33a approaches the lower surface of the holder 2 in a contactless manner. When the loading cams 33 are rotated by the loading motor 37, circular cam surfaces 33b of the cams 33 are come into contact with the optical card 1 and convey the card 1 to a predetermined position of the card holding portion 22. Then, the flat cam surfaces 33a again face the holder 2 and the motor 37 stops. The card 1 is ejected out by rotating the cams 33 in the direction opposite to that in the loading operation.

A guide rod 27 is arranged on the rear side of the holder 2 in the direction perpendicular to the moving direction of the holder 2. The guide rod 27 movably supports a slide member 28 and couples the slide member 28 to the card feeding mechanism 5 in the following manner.

The card feeding mechanism 5 is constructed in the following manner. Two shafts 51 are rotatably supported to a fixed frame 50 in the casing 10. Pulleys 52 and 53 are fixedly attached to both shafts 51. An endless belt 54 is wound and reeved between the pulleys 52 and 53. A coupling pin 55 is vertically attached at a proper position of the endless belt 54. The pin 55 is rotatably coupled with the slide member 28. A pulley 56 is fixed to the lower portion of the shaft 51. A rotational force of a drive motor 58 which can rotate in a single direction is transferred to the pulley 56 through transfer means 57 such as a belt or the like. A rotary encoder 59 is attached to the other shaft 51. A center of gravity G of the card holder 2 and a driving center point P of the feeding mechanism 5 are aligned on the same line which is parallel with the moving direction of the holder 2 when it is seen from the flat surface (also from the side surface) in the case where the holder 2 is moved from the card inserting port side toward the rear direction. Such an arrangement is realized by setting the center of the coupling pin 55 of the slide member 28 to a position on a card feeding direction line passing through the center of gravity G of the holder 2.

The optical head 6 is supported to a lead screw 60 which is rotatably supported in the direction perpendicular to the moving direction of the holder 2 and to a fixed guide rod 61. The lead screw 60 is driven by a head feeding motor 62 which can forwardly and reversely rotate. Therefore, when the motor 62 operates, the optical head 6 is guided by the guide rod 61 and lead screw 60 and is moved in the direction perpendicular to the feeding direction of the optical card 1 by the rotation of the lead screw 60. Thus, the optical head 6 accesses a predetermined information recorded on a recording track of the optical card 1. A head feeding mechanism 7 is constructed by the lead screw 60, guide rod 61, and motor 62.

The operation of the optical card recording/reproducing apparatus with the above construction will now be described. In a card insertion waiting state, the holder 2 is located near the card inserting port 11. In this state, when the optical card 1 is inserted from the card inserting port 11 and the card insertion is detected by the sensor 31, the card loading/ejecting mechanism 3 operates. Thus, the inserted optical card 1 is automatically carried to the card holding mechanism 21.

Subsequently, when the drive motor 58 of the card feeding mechanism 5 operates and the endless belt 54 is moved, the coupling pin 55 formed on the belt 54 draws and moves the holder 2 along the guide shafts 13 through the slide member 28. The holder 2 is reciprocated by the continuous rotation in the single direction of the drive motor 58. While the holder 2 is being returned toward the card inserting port 11, the information recording portion 16 of the optical card 1 is relatively moved with respect to the optical head 6, thereby recording/reproducing information. When the holder 2 is returned to the first position on the side of the inserting port 11, the head feeding motor 62 operates and the optical head 6 accesses the track through the lead screw 60 and guide rod 61. The card feeding operation is again repeated in a manner similar to the above.

FIG. 27 shows an example of a construction of the optical head 6. The head 6 comprises: a light projection optical system 71 to irradiate the light onto the optical card 1; and a light reception optical system 81 to receive the reflected lights from the optical card 1.

The light projection optical system 71 includes: a semiconductor laser 73, a collimating lens 74, a warping prism 75, a diffraction grating 76, a reflecting mirror 77, and an objective lens 78. The spreading light emitted from the semiconductor laser 73 is transformed into the parallel beam having an elliptic cross section by the collimating lens 74. After the parallel beam was warped to the beam having an almost circular cross section by the warping prism 75, it is divided into three light beams by the diffraction grating 76.

The three light beams are led in the direction of the optical card 1 by the reflecting mirror 77 and images are formed onto the optical card 1 by an objective lens 78. As shown in FIG. 28, a light spot SPa due to a 0th-order diffracted light is formed on the information recorded or recording track 17. On the other hand, light spots SPb and SPc due to positive and negative primary diffracted lights are formed on the track guides 18 on both sides of the track 17, respectively.

In addition to the objective lens 78 and the reflecting mirror 77, the light reception optical system 81 includes: condenser lenses 82 and 83; a half-mirror 84; and photo detectors 85 and 86. The reflected lights of the light spots SPa, SPb, and SPc are converged by the condenser lenses 82 and 83 through the objective lens 78 and reflecting mirror 77. The converged light is separated by the half-mirror 84. The separated lights are projected to the photo detectors 85 and 86, respectively.

In the above optical system, in order to accurately form the image of the light spot SPa onto the information recording portion 16 of the optical card 1, it is necessary to control the distance between the optical card 1 and the objective lens 78 (focusing control). On the other hand, in order to accurately form the image of the light spot SPa to the position of the information recorded or recording track 17 in the information recording portion 16, it is necessary to control the position of the objective lens 78 (tracking control). A focusing error signal and a tracking error signal which are used for the focusing control and tracking control are produced from light detection signals of the photo detectors 85 and 86. On the basis of the focusing error signal, a focusing servo mechanism controls the distance of the objective lens 78 to the optical card 1. On the basis of the tracking error signal, a tracking servo mechanism controls the position in the lateral direction of the objective lens 78 so that the light spots SPb and SPc are located on the track guides 18.

In the recording mode, in a state in which the automatic focusing and tracking controls were executed, the semiconductor laser 73 is driven by high power pulses which were modulated on the basis of data to be recorded while moving the optical card 1 in the direction along the track guides 18, thereby causing a thermal irreversible change on the information recording portion 16 of the optical card 1 by the 0th-order diffracted light. In this manner, a pit train is produced and information is recorded.

On the other hand, in the reproducing mode, in a similar state in which the automatic focusing and tracking controls were executed, the pit train is scanned by the 0th-order diffracted light while moving the optical card 1 in the direction of the track guide 18, thereby detecting the reflected lights by the photo detector 86. The recorded information on the optical card 1 is read out on the basis of an output signal of the photo detector 86.

FIG. 29 shows a circuit block diagram of the optical card recording/reproducing apparatus with the above construction. The optical head 6 is controlled by focusing control circuit 45 and a tracking control circuit 46 and is electrically connected to a system controller 48 through a signal processor 47 for processing the light detection signal. The focusing control circuit 45 and tracking control circuit 46 are controlled by the system controller 48. The card loading/ejecting mechanism 3 and the head feeding mechanism 7 are electrically connected to the system controller 48. The card feeding mechanism 5 is also electrically connected to the system controller 48 through a card feeding control circuit 44. The operation in each section of the mechanisms in the recording or reproducing mode is controlled by the system controller 48. The system controller 48 is connected to an external terminal device 70 through an external interface 49.

In the optical card recording/reproducing apparatus with the above construction, the focusing error signal and tracking error signal, as fundamental signals for the focusing and tracking servo controls, are formed on the basis of the light emitted from the semiconductor laser 73 as a light source. Therefore, when the semiconductor laser 73 is intermittently driven by a large amount of power in the information recording mode, the fundamental signals are largely fluctuated, so that focusing and tracking control errors occur. To avoid such errors, when the semiconductor laser 73 is intermittently driven to output a large output, it is necessary to interrupt the focusing and tracking controls and to keep the position of the objective lens 78 to the position just before the driving by a high power. Consequently, such control becomes very complicated.

When the recorded information is reproduced, a pit train of the pits 19 on the track 17 is scanned by the light spot SPa of an almost same size as that of the pit 19 and a change in light amount of the reflected light is detected by the photo detector 86. Therefore, if a vibration occurs in association with the conveyance of the optical card 1, the light spot SPa is deviated from the pit 19, so that an S/N ratio of the light detection signal deteriorates. Particularly, in the optical card recording/reproducing apparatus, the vibration is larger than that in the optical disk drive apparatus or the like. If the recording or reproducing speed of information is intended to increase, the vibration also increases due to such a high speed operation. Therefore, it is difficult to realize the high recording/reproducing speed.

Further, when the recorded information is reproduced, the semiconductor laser 73 is used in a state in which its power is reduced to a lower limit level enough to stably oscillate. However, even in the case of such a low level, there is a problem such that energy densities of the light spots SPa to SPc are still high and the pits 19 and track guides 18 on the optical card 1 are deteriorated by the repetitive reproducing operations, so that the light detection signal level is decreased.

FIG. 30 is a constructional diagram showing another example of a general construction of an optical head which is assembled in the optical card recording/reproducing apparatus.

In the diagram, the optical head comprises: a semiconductor laser 91 as a light source to project a light to the optical card 1 side; a photo detector 100 which is constructed by various kinds of photo sensitive elements for receiving the reflected lights from the optical card 1 and outputting electric signals corresponding to amounts of lights detected; and an optical system for leading the light emitted from the semiconductor laser 91 to the optical card 1 and for leading the reflected lights from the optical card 1 to the photo detector 100. The optical system comprises: a collimating lens 92; a deflecting beam splitter 93; an objective lens 94; and a condenser lens 95.

In the above construction, the light emitted from the semiconductor laser 91 is transmitted through the collimating lens 92 and deflecting beam splitter 93 and reaches the objective lens 94. Then, it is converged by the objective lens 94 and is irradiated onto the optical card 1. In a manner opposite to the above, the reflected lights from the optical card 1 pass through the objective lens 94 and are deflected by the deflecting beam splitter 93 and are converged by the condenser lens 95 and are input to the photo detector 100. The photo detector 100 has reproduction signal photo sensitive elements, photo sensitive elements for focusing control, and a photo sensitive element for tracking control. Electric signals corresponding to detected light amounts are output from the photo sensitive elements, respectively.

A focusing control mechanism in the optical head will now be described with reference to FIG. 31.

In the diagram, the lights reflected by the optical card 1 in the light emitted from the semiconductor laser 91 pass through the condenser lens 95 and are detected by two photo sensitive elements 101a and 101b for focusing control included in the photo detector 100. Electric signals from the photo sensitive elements 101a and 101b for focusing control are respectively amplified by amplifiers 105a and 105b and are given to a differential amplifier 106 to amplify the difference between the amplified outputs of the amplifiers 105a and 105b. A drive mechanism 109 of the objective lens 94 is driven by a focusing control circuit 107 on the basis of a differential output F of the differential amplifier 106.

In the above construction, when the optical card 1 exists at a position indicated by A and a relative distance between the optical card 1 and the objective lens 94 is set to the optimum distance, the reflected lights from the optical card 1 pass through the objective lens 94 and condenser lens 95 and enter the photo sensitive elements 101a and 101b for focusing control with an equal light amount, so that the differential output F of the differential amplifier 106 is set to zero.

On the other hand, if the optical card 1 exists at a position shown by B or C, the reflected lights are deviated to either one of the photo sensitive elements 101a and 101b and form an image, so that the differential amplifier 106 outputs the negative or positive differential output F.

FIG. 32 is a graph showing the relation between the relative distance between the objective lens 94 and the optical card 1 and the differential output F in the above construction. When the optical card 1 exists at the position A, the difference output F is set to zero. When the optical card 1 exists at the position of B or C, the differential output F has a negative or positive value corresponding to the relative distance. Such a case corresponds to a state in which the focusing control is not correctly executed. When the signal having a negative or positive value is output as a differential output F, in order to set the differential output F to zero, the focusing control circuit 107 actuates the drive mechanism 109 so as to adjust the position of the objective lens 94, that is, to execute what is called a focusing control.

However, when the focusing control as mentioned above is executed, there are the following problems.

FIGS. 33a and 33b are diagrams showing the corresponding relations among the optical card 1, an irradiation light spot SP (corresponding to a detection light spot on the photo sensitive elements for focusing control) which is projected onto the optical card 1, and the photo sensitive elements 101a and 101b for focusing control. As shown in FIG. 33a, when the irradiation light spot SP exists at a normal position in the direction perpendicular to the track guides 18 of the optical card 1, the irradiation light spot SP includes two track guides 18 in its region. The differential output F in this case is obtained as shown by a solid line in the graph of FIG. 32. On the other hand, if the light spot SP exists at a position which is deviated from the normal position as shown in FIG. 33b, the light spot SP irradiates three track guides 18. In such a case, a reflected light amount 18 decreases by the amount of one track guide (that is, the reflectance of the track guide is smaller than those of the other portions as mentioned above), so that the differential output F decreases as shown by a broken line in FIG. 32. As mentioned above, there is a problem such that when the differential output F fluctuates, the focusing control cannot be accurately executed.

As a method of solving the above problems, for instance, there is considered to provide a holding mechanism for always keeping the irradiating position of the irradiation light spot SP to the optical card 1 to the normal position or to provide a correction processing circuit of the differential signal F for the focusing control circuit 107. However, such methods are not practical because a construction of the apparatus becomes complicated and it takes a long processing time.

As another optical card recording/reproducing apparatus, there has been known an apparatus having a construction in which photo sensitive elements for recording/reproducing, photo sensitive elements for focusing control, and a photo sensitive element for tracking control are respectively arranged on one flat surface as the photo detector 100. FIGS. 34a and 34b are diagrams showing the corresponding relations among recording/reproducing photo sensitive elements 102, the photo sensitive elements 101a and 101b for focusing control, and a photo sensitive element 103 for tracking control of the photo detector 100, an irradiation light spot SP1 on the optical card 1 (an incident light spot on the photo detector 100 is also the same as the irradiation light spot SP1), and the optical card 1. In the photo detector 100, the photo sensitive elements 101a and 101b for focusing control are arranged in the lower portion, one of the recording/reproducing photo sensitive elements 102 is arranged in the upper portion, the photo sensitive element 103 for tracking control is arranged in the further upper portion, and the other recording/reproducing photo sensitive element 102 is arranged in the further upper portion ("upper" and "lower" denote "upper" and "lower" in FIGS. 34a and 34b).

However, when the focusing control is executed in the photo detector 100 in which the photo sensitive elements 101a, 101b, 102, and 103 are arranged on one flat surface, there are the following problems.

That is, as shown in FIG. 34a, when the major axis direction of the elliptic detection light spot SP1 which is obtained in the photo detector 100 coincides with the arranging direction of the photo sensitive elements 101a to 103, the focusing control is correctly executed. However, as shown in FIG. 34b, if the major axis of the detection light spot SP1 is inclined and deviated from the normal position, even if the focusing state is normal (the position shown by A in FIG. 31), a large amount of incident light from the detection light spot SP1 is detected by either one of the photo sensitive elements 101a and 101b for focusing control. Such a state is not regarded as a correct focusing state, so that the focusing control cannot be correctly executed. Such a situation in which the detection light spot SP1 is inclined and deviated from the normal position occurs in the case where the irradiation light spot SP1 was obliquely irradiated onto the optical card 1 or where the detection light spot SP1 by the reflected light is formed onto the photo detector 100 in a twisted state due to a fluctuation of the optical system.

As a method of solving the above problems, for instance, there is considered to provide an adjusting mechanism for adjusting so that the major axis direction of the detection light spot SP1 coincides with the arranging direction of the photo sensitive elements 101a to 103. However, such a method is not practical because a construction of the apparatus becomes complicated and it takes a long processing time.

FIG. 35 shows the detecting operation of further another photo detector. That is, FIG. 35 is a diagram for explaining a detected light amount of the recording/reproducing photo sensitive elements of the photo detector 100 in the case where the optical card 1 was scanned by the irradiation light spot (corresponding to the detection light spot). When the optical card 1 is moved in the direction of a blank arrow, the irradiation light spot relatively moves to the positions indicated by SP21, SP22, and SP23. When a light spot SP21 is projected to the position where the pit 19 exists in association with the movement of the light spot, the reflected light amount becomes minimum and the detected light amount is also set to the minimum value $k_1$. On the other hand, when a light spot SP23 is projected to the position where no pit 19 exists, the reflected light amount is set to the maximum value $k_2$. A reproduction signal is formed on the basis of such a detected light amount.

However, in the above construction, there is a problem such that the detected light amount is not accurately obtained in correspondence to the presence or absence of the pit 19 and a reproduction signal of the correct information cannot be formed.

That is, for instance, if the irradiation light spot SP22 exists at the just intermediate position of the two pits 19, both side portions of the irradiation light spot SP22 are projected to the pits 19 locating on both sides, respectively. Thus, an intermediate light amount $k_3$ between the minimum light amount $k_1$ and the maximum light amount $k_2$ is detected. Such an intermediate light amount $k_3$ becomes an obstacle upon formation of the reproduction signal.

SUMMARY OF THE INVENTION

It is an object of the present invention to provide a novel optical card recording/reproducing apparatus in which by forming a slit-like optical image onto an optical card, the focusing and tracking controls can be easily executed, the recording/reproducing operations can be executed at a high speed, and the deterioration of pits and track guides is prevented.

Another object of the invention is to provide an optical card recording/reproducing apparatus in which even if the position matching of an irradiation light spot in the direction perpendicular to track guides is improper, the focusing control can be always accurately executed.

Still another object of the invention is to provide an optical card recording/reproducing apparatus in which even if the longitudinal direction of a detection light spot differs from the arranging direction of photo sensitive elements, the focusing control can be always accurately executed.

The invention is made in consideration of the above problems and further another object of the invention is that a detected light amount can be accurately obtained in correspondence to the presence or absence of information pits and a reproduction signal of correct information can be formed.

To accomplish the above object, according to the invention, in an optical card recording/reproducing apparatus for recording/reproducing information by relatively moving an optical card for an optical head, the optical head has an optical system for producing focusing and tracking control signals and a light emitting diode whose light emitting surface is formed like a slit is included as a light source in the optical system.

When information is recorded/reproduced, the light source comprising the light emitting diode is continuously driven and the focusing and tracking controls are executed. A slit-shaped optical image corresponding to the light emitting surface of the light source is formed on the optical card. Therefore, even if a vibration due to the conveyance of the optical card occurs, the slit light always irradiates pits and track guides and an S/N ratio of the light detection signal does not deteriorate and the high recording/reproducing speed can be realized.

To reproduce the recorded information, the light which is emitted from the light emitting diode of a low energy density is used. Therefore, even if the reproducing operation is repeated, there is no fear of decrease in light detection signal level due to the deterioration of pits and track guides on the optical card.

According to the invention, there is provided an optical card recording/reproducing apparatus comprising a light source, a photo detector, and an optical system for converging the light from the light source onto the optical card and for forming an image of the reflected lights onto the photo detector, wherein a detection width of photo sensitive elements for focusing control of the photo detector in the direction perpendicular to tracks on the optical card is set to the length which is integer times as long as the pitch of the track guides on the optical card in a detection light spot on the photo sensitive elements for focusing control.

According to the construction of the invention, the detection width of the photo sensitive elements for focusing control in the direction perpendicular to the tracks on the optical card is set to the length which is integer times as long as the pitch of the track guides on the optical card in a detection light spot on the photo sensitive elements for focusing control. Therefore, upon scanning, even if the irradiation light spot faces the optical card at any position in the direction perpendicular to the track guides on the optical card, the total width of the track guide images which are formed on the photo sensitive elements for focusing control is always constant. Due to this, a focusing error signal is stably obtained, so that the focusing control can be always accurately executed without making the construction of the apparatus complicated and without requiring a long processing time.

Further, the invention provides an optical card recording/reproducing apparatus comprising a light source, a photo detector, and an optical system for converging the light from the light source onto an optical card and for forming an image of the reflected lights onto the photo detector, wherein the photo detector has two pairs of photo sensitive elements for focusing control which are arranged so as to be located away from each other at a predetermined distance in the direction perpendicular to the direction of tracks on the optical card.

A sum signal of a light detection signal of one of the photo sensitive elements of one of the two pairs and a light detection signal of one of the photo sensitive elements of the other pair is extracted. A sum signal of a light detection signal of the other photo sensitive element of one of the two pairs and a light detection signal of the other photo sensitive element of the other pair is extracted. The difference of those two sum signals is used as a focusing error signal.

According to the invention, even if a projection light spot for focusing control is inclined to the direction perpendicular to the track guides on the optical card, the focusing error signal is obtained on the basis of the above sum signals, so that the accurate focusing control can be always accomplished.

Further, according to the invention, in an optical card recording/reproducing method a light from a light source is converged onto an optical card and an image of the reflected lights is formed onto a photo detector, wherein a detection width of a photo sensitive element for reproduction of the photo detector corresponding to the direction of the tracks on the optical card is set to a value which is equal to or smaller than the minimum arrangement interval of information pits on the tracks of the optical card in a detection light spot obtained by the reproducing photo sensitive element.

According to the invention, in an optical card recording/reproducing apparatus comprising a light source, a photo detector, and an optical system for converging the light from the light source onto an optical card and for forming an image of the reflected lights onto the photo detector, wherein a detection width of a photo sensitive element for reproduction of the photo detector corresponding to the direction of tracks on the optical card is set to a value which is equal to or smaller than the minimum arrangement interval of information pits on the tracks of the optical card in a detection light spot obtained by the recording/reproducing photo sensitive element.

According to the invention, in an optical card recording/reproducing apparatus comprising a light source, a photo detector, and an optical system for converging the light from the light source onto an optical card and for forming an image of the reflected lights onto the photo detector, wherein a masking is provided on a reproducing photo sensitive element surface of the photo detector in a manner such that a detection width of the photo sensitive element surface corresponding to the direction of tracks on the optical card is set to a value which is equal to or smaller than the minimum arrangement interval of information pits on the tracks of the optical card in a detection light spot which is obtained by the reproducing photo sensitive element.

According to the invention, even when the center of the irradiation light spot exists at the intermediate position of two information pits and is projected to those information pits, the detection width of the reproducing photo sensitive element is set to a value which is equal to or smaller than the minimum arrangement interval of the information pits in the detection light spot, so that a light amount indicative of the absence of the information pit is detected without being influenced by the information pits. Due to this, a detected light amount is accurately obtained in correspondence to the presence or absence of the information pits and a reproduction signal of correct information can be obtained.

BRIEF DESCRIPTION OF THE DRAWINGS

FIGS. 15a and 15b relate to another embodiment of the invention and are diagrams showing the corresponding relations among an optical card, an irradiation light spot (corresponding to a detection light spot in photo sensitive elements for focusing control) which is irradiated onto the optical card, and photo sensitive elements for focusing control;

FIGS. 17a to 18 relate further another embodiment of the invention;

FIGS. 17a and 17b are front views of different embodiments of recording/reproducing photo sensitive elements;

FIG. 18 is an explanatory diagram for explaining a detected light amount of the recording/reproducing photo sensitive elements of a photo detector corresponding to a scanning state of an irradiation light spot (corresponding to a detection light spot) to the optical card;

FIGS. 19 to 35 show a related art;

FIG. 19 shows a whole optical card and an enlarged part of this card;

FIG. 20 is a plan view showing a schematic arrangement of an optical card recording/reproducing apparatus;

FIG. 21 is a cross sectional view taken along the line XXI—XXI in FIG. 20;

FIG. 22 is a cross sectional view taken along the line XXII—XXII in FIG. 20;

FIG. 23 is a plan view of a holder showing an external view of a card holding mechanism;

FIG. 24 is a cross sectional view showing a structure of the card holding mechanism;

FIG. 25 is a front view showing the structure of the card holding mechanism;

FIG. 26 is a cross sectional view showing the operation of the card holding mechanism;

FIG. 27 shows an optical system of an optical head;

FIG. 28 shows light spots on an optical card;

FIG. 29 is a block diagram showing a circuit construction of an optical card recording/reproducing apparatus;

FIG. 30 shows a general construction of an optical head;

FIG. 31 shows a general construction of a focusing control mechanism;

FIG. 32 is a graph showing the relation between a differential output and a relative distance upon focusing control;

FIG. 35 is a diagram corresponding to FIG. 18.

DETAILED DESCRIPTION OF THE PREFERRED EMBODIMENTS

Figure 1:
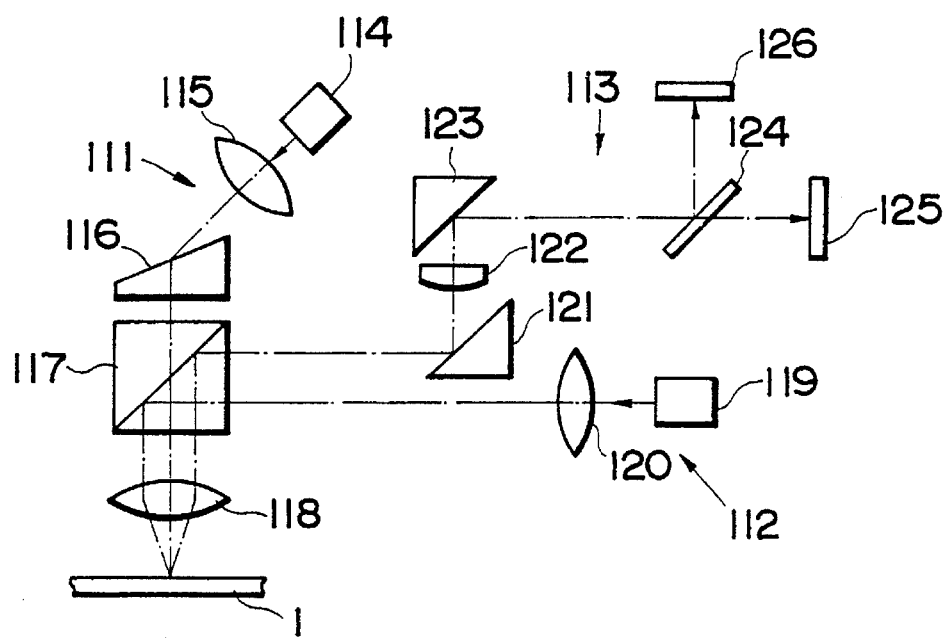
FIG. 1 is a diagram showing an optical system of an optical head in an embodiment of the present invention.

In an embodiment of an optical card recording/reproducing apparatus according to the present invention, FIG. 1 shows an optical system of an optical head which is assembled in such an apparatus. A mechanical structure of the optical card recording/reproducing apparatus is practically similar to that shown in FIGS. 20 to 26 and its description is omitted here.

The optical system shown in FIG. 1 includes: a first light projection optical system 111 using a semiconductor laser 114 as a light source; and a second light projection optical system 112 using an end face light emitting diode 119 as a light source. The light emitted from the second light projection optical system 112 is projected onto the optical card 1 and the reflected lights are led to photo detectors 125 and 126 and are detected by a light reception optical system 113.

Figure 5:
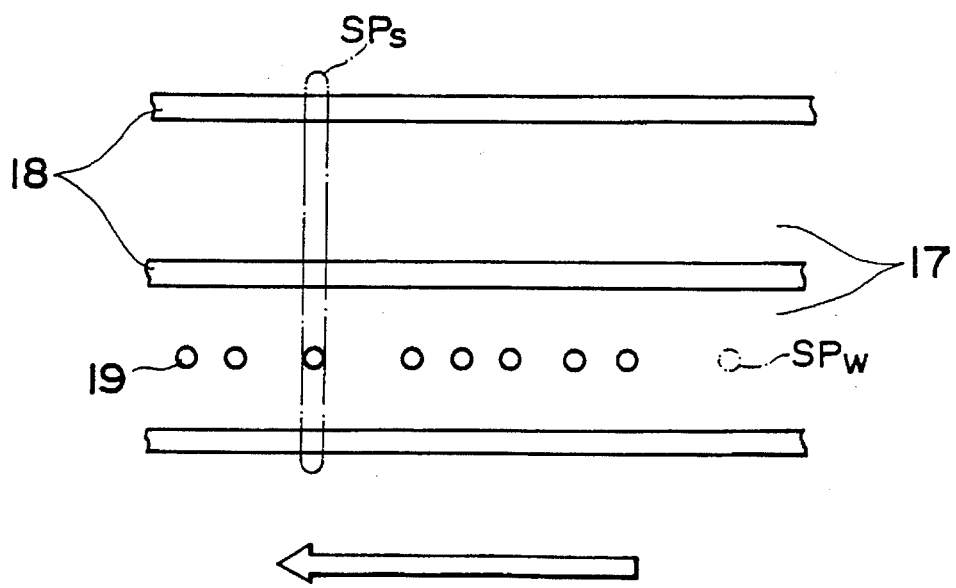
FIG. 5 shows a light spot forming state on an optical card.

The first light projection optical system 111 is used to record information and uses the semiconductor laser 114 as a light source and includes a collimating lens 115, a warping prism 116, a deflecting beam splitter 117, and an objective lens 118. The semiconductor laser 114 is driven only in the information recording mode. The light emitted from the semiconductor laser 114 is transformed to a parallel beam having an almost elliptic cross section by the collimating lens 115. Only the minor axis direction of the ellipse of the parallel beam is enlarged by the warping prism 116, so that the cross section of the parallel beam is warped into an almost circle. The circular beam substantially comprises a P polarization light component due to the characteristics of the semiconductor laser 114. The almost circular beam passes through the deflecting beam splitter 117 and enters onto the objective lens 118. The light is converged onto the optical card 1 by the objective lens 118 and becomes a circular light spot $SP_w$ as shown in FIG. 5. An energy density is locally raised by the light spot $SP_w$ and a thermal irreversible change is caused in the information recording portion 16 of the optical card 1, thereby forming the pits 19 indicative of the information to be recorded.

The optical card 1 is moving in the direction (shown by an arrow in FIG. 5) along the track guides 18. When pulses modulated by the information to be recorded are given to the semiconductor laser 114 and the laser 114 emits the pulse-like light, the pits 19 are successively formed onto the optical card 1 and the information is recorded as a pit train onto the information recording track 17.

The second light projection optical system 112 uses the end face light emitting diode 119 as a light source and the light emitted from the diode 119 is transformed into an almost parallel beam by a collimating lens 120. Only the S polarization light component of the parallel beam is reflected by the deflecting beam splitter 117 and enters the objective lens 118 at an angle which is deviated from the optical axis by, for instance, about 1 mm. An image of the light emitting surface of the end face light emitting diode 119 is formed onto the optical card 1.

The light emitting surface of the diode 119 has a slit-like (elongated rectangular) shape. The diode 119 is continuously driven in the recording and reproducing modes and forms a slit-like optical image $SP_s$ as shown in FIG. 5 onto the optical card 1.

Figure 2:
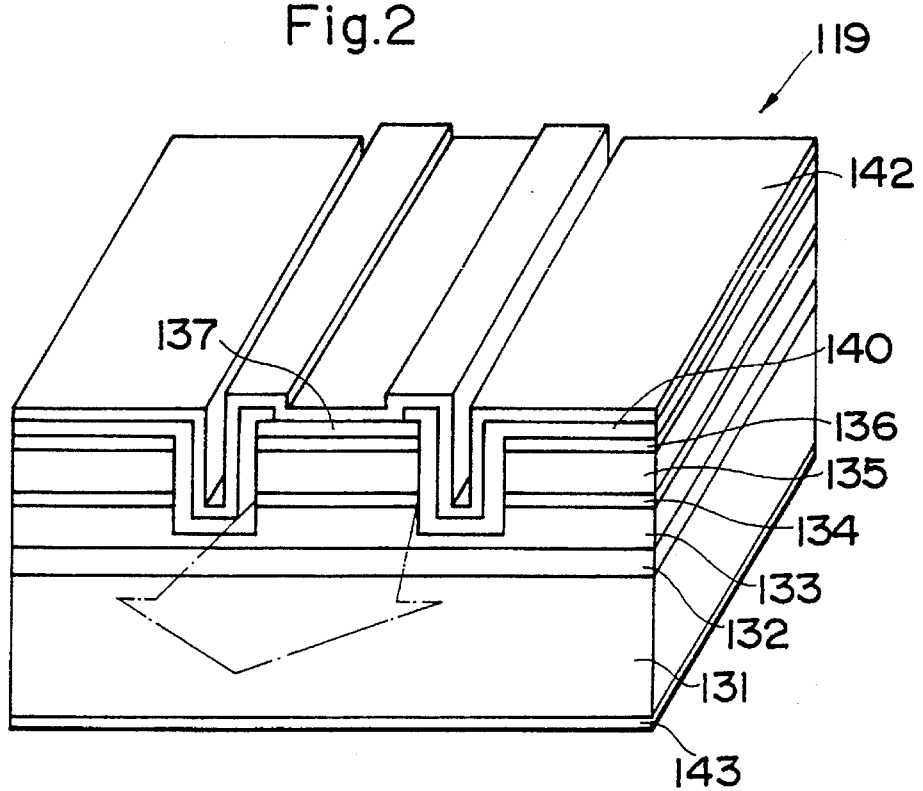
FIG. 2 is a perspective view showing an element structure of an end face light emitting diode.

A broad mesa type end face light emitting diode or the like is used as the end face light emitting diode 119. FIG. 2 shows a structure of the diode 119. FIGS. 3a to 3f show in detail the manufacturing steps of the diode 119.

Figure 3A:
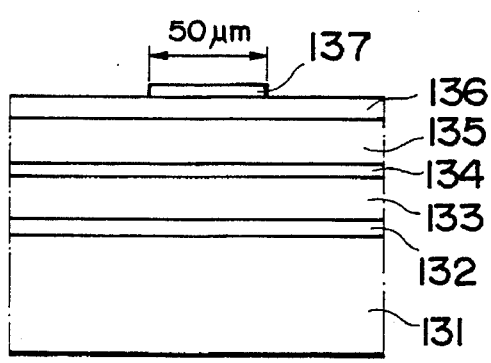
FIGS. 3a to 3f are explanatory diagrams showing manufacturing processes of the end face light emitting diode.

In FIG. 3a, an n-GaAs buffer layer 132, an n-AlGaAs lower clad layer 133, a GRIN-SQW (Graded Index Single Quantum Well) active layer 134, a p-AlGaAs upper clad layer 135, and a p-GaAs cap layer 136 are first grown onto an (100) n-GaAs substrate 131 by an MBE (molecular beam epitaxy) process, thereby forming a GRIN-SCH-SQW structure (SCH: Separate Confinement Heterostructure). Although not shown, the GRIN-SQW active layer 134 has a central single quantum well (SQW) layer and upper and lower GRIN layers which are arranged on and under the SQW layer. The n-GaAs buffer layer 132 includes a super lattice buffer layer.

For instance, in the case of the light emitting diode which emits a slit light of a width of 50 μm, a Cr/Au layer 137 of a width of 50 μm is formed onto the cap layer 136 by a lift-off process.

Figure 3C:
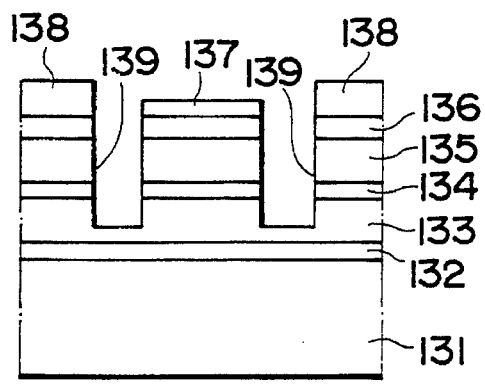
Figure 3B:
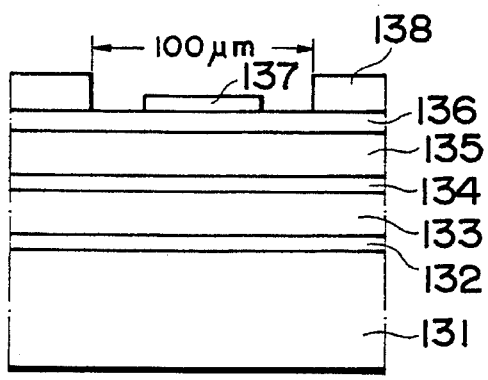

Next, as shown in FIG. 3b, an AZ resist 138 is again coated onto the upper surface of the cap layer 136 and a window of a width of 100 μm is formed around the Cr/Au layer 137 as a center.

The etching is executed by using the Cr/Au layer 137 and AZ resist 138 as etching masks by an RIE (Reactive Ion Etching) process using $BCl_3$ until the etched region reaches the lower clad layer 133, thereby forming a groove 139 as shown in FIG. 3c and forming a mesa structure of a width of 50 μm. Thereafter, the AZ resist 138 is eliminated by an $O_2$ ashing process.

Figure 3D:
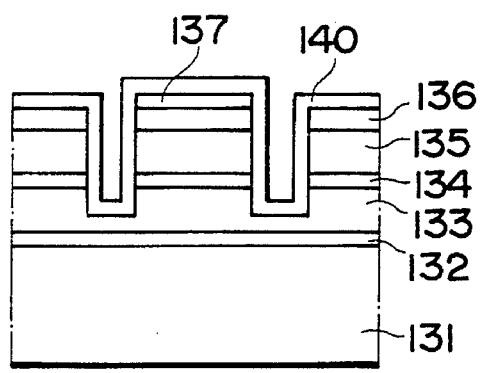

Next, as shown in FIG. 3d, an SiNx insulative film 140 is formed onto the whole upper surface including the grove 139 of the wafer by a plasma CVD process.

Figure 3E:
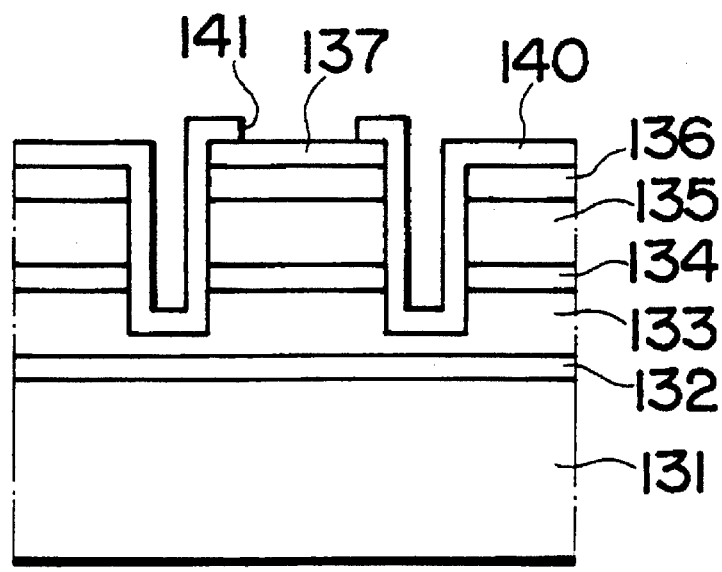

Further, as shown in FIG. 3e, the window etching for contacting is executed by an RIE process using the $CF_4+H_2$ gas, thereby forming a window 141 in the insulative layer 140 in the upper portion of the Cr/Au layer 137.

Figure 3F:
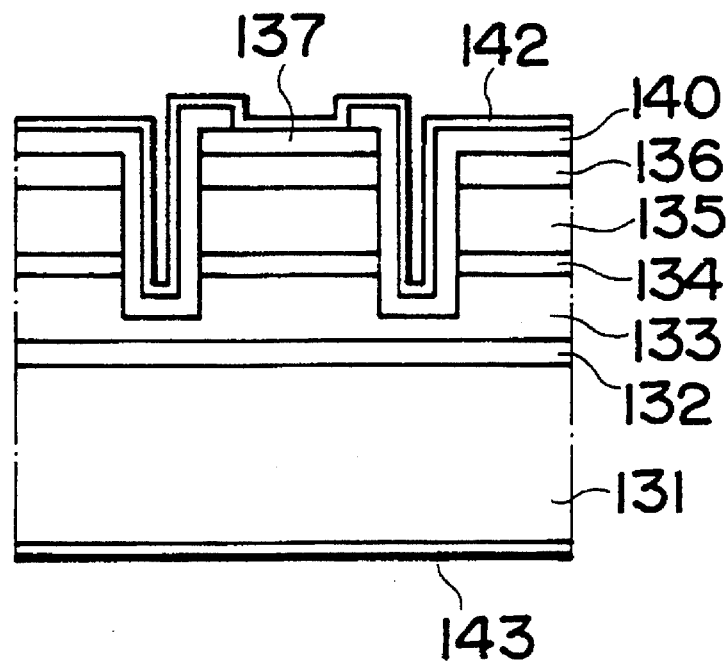

Finally, the back surface is ground and polished and as shown in FIG. 3f, a Cr/Au electrode 142 and an AuGeNi/Au electrode 143 are evaporation deposited onto both surfaces, thereby forming alloys, respectively.

A bar of a resonator length of about 100 μm is cut out by a cleavage process from the wafer which was manufactured as mentioned above. An $Al_2O_3$ layer (nonreflective coating) of a thickness of λ/4n (λ: wavelength of light, n: refractive index) is formed on the outgoing face side. After that, the bar is divided into chips. The divided chip is assembled onto a heat sink of Si by soldering AuSn in a junction down process.

Figure 4:
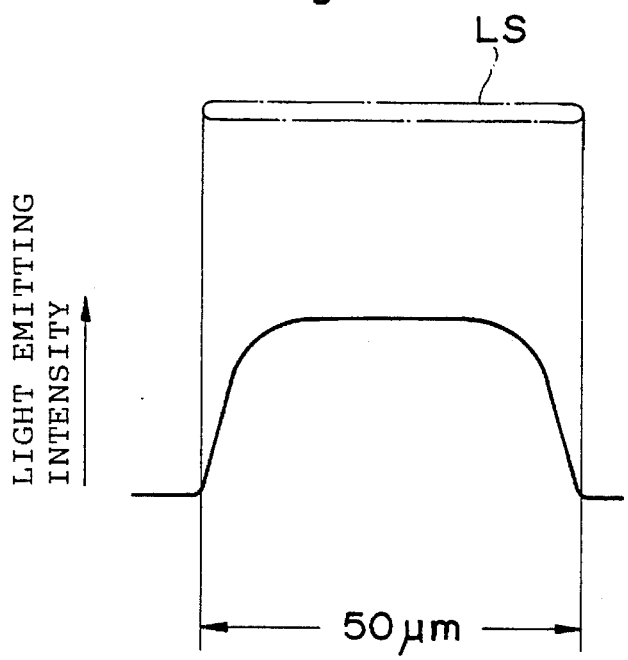
FIG. 4 shows a light emitting surface of the end face light emitting diode and its light emitting intensity.

A light emitting center wavelength of the end face light emitting diode 119 which was manufactured as mentioned above is set to, for instance, 780 μm. The diode 119 has a slit-like light emitting surface LS as shown in FIG. 4 and its light emitting intensity is almost uniform in the surface as shown in the diagram.

FIG. 5 shows the light image $SP_s$ of the light emitting surface of the diode 119 which is formed on the optical card 1. The light image $SP_s$ crosses almost perpendicularly the track guides 18 on the optical card 1. For instance, a length of light image SPs is set to 50 μm and a width is set to about 3 μm and the range covering three track guides 18 is illuminated.

In FIG. 5, the light spot $SP_w$ by the semiconductor laser 114 is formed at a position which is away from the light image $SP_s$ by the end face light emitting diode 119 by about 50 μm. Upon assembly and adjustment of the optical head, the relative distance between the light image $SP_s$ and the light spot $SP_w$ can be obtained by giving a relative angle difference between the optical axis of the light of the semiconductor laser 114 and the optical axis of the light of diode 119 both of which light enter the objective lens 118.

It is now assumed that the relative distance between the light spot $SP_w$ by the semiconductor laser 114 and the light image $SP_s$ by the end face light emitting diode 119 is set to l and a focal distance of the objective lens 118 is set to f. Then, a relative angle difference θ between the optical axes to be given is obtained as follows.

$$\theta = \tan^{-1}\frac{l}{f} \text{ [rad]}$$

When the relative angle difference θ is given as mentioned above, the optical axis of the diode 119 is adjusted by using the optical axis of the semiconductor laser 114 as a reference. However, the optical axis of the laser 114 can be also adjusted by using the optical axis of the diode 119 as a reference. Or, another temporary reference is provided and on the basis of the temporary reference, the optical axes of the laser 114 and diode 119 can be also adjusted.

Returning to FIG. 1, in addition to the objective lens 118 and deflecting beam splitter 117, the light reception system 113 includes reflecting mirrors 121 and 123, a condenser lens 122, and a half-mirror 124. The slit-like light image $SP_s$ by the diode 119 is light amount modulated on the optical card 1 in accordance with the presence or absence of the track guides 18 and pits 19 and is reflected. The reflected lights pass through the objective lens 118 in the opposite direction and are led to the deflecting beam splitter 117 in a state of the almost parallel beam. The reflected lights substantially hold the S polarization light component because of the regular reflection and are reflected by the reflecting surface of the beam splitter 117 and are led to the condenser lens 122 through the reflecting mirror 121.

The light converged by the condenser lens 122 is further led to the half-mirror 124 through the reflecting mirror 123. A part of the light passes through the half-mirror 124 and reaches the photo detector 125. The remaining part of the light is reflected by the half-mirror 124 and reaches the other photo detector 126. The light image $SP_s$ on the optical card 1 is formed onto the light detecting surface of each of the photo detectors 125 and 126.

Now, assuming that the focal distance of the objective lens 118 is set to f and a focal distance of the condenser lens 122 is set to $f_a$, an enlargement magnification is given by ($f_a$/f). Therefore, when the focal distance $f_a$ of the condenser lens 122 is set to, e.g., $f_a$=150 mm and the focal distance f of the objective lens 118 is set to, e.g., f=4.5 mm, the enlargement magnification ($f_a$/f) is set to $f_a$/f=150/4.5≈33.3 (times).

Figure 6:
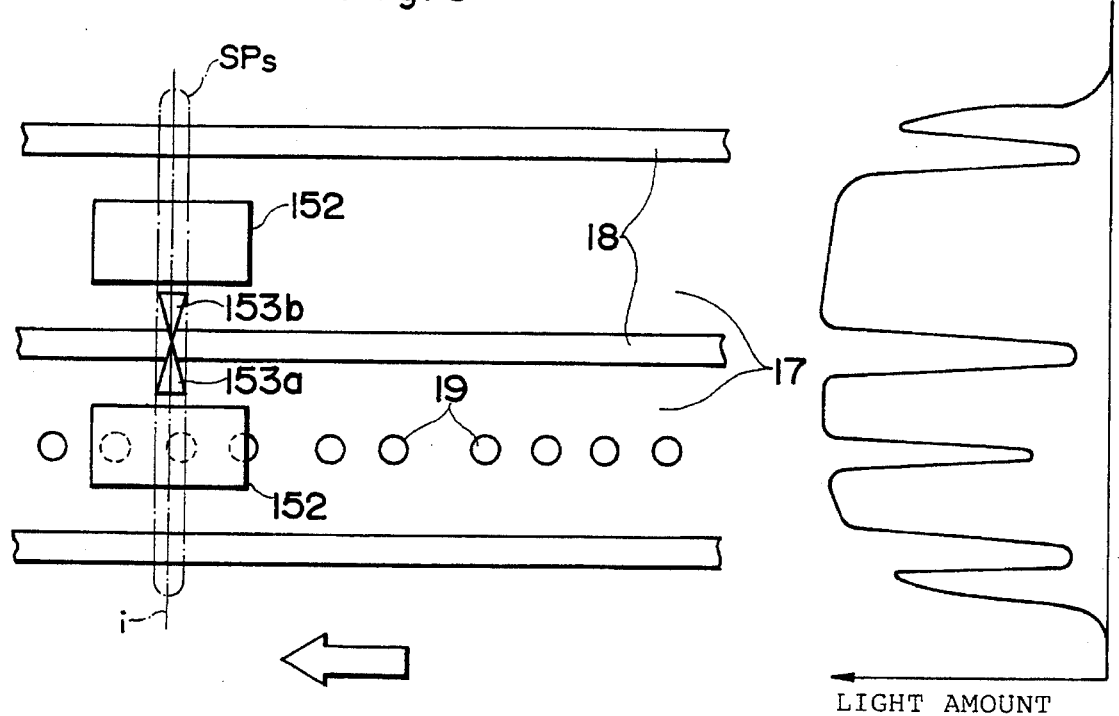
FIGS. 6 and 7 show light images projected onto a photo detector.
Figure 7:
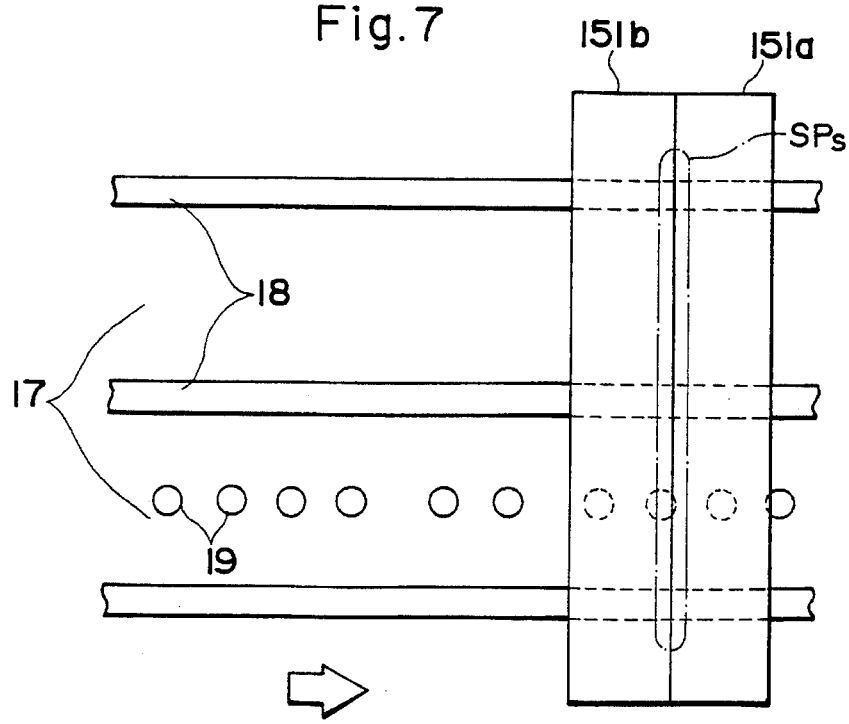

FIG. 6 shows the optical image projected onto the photo detector 125 and FIG. 7 shows the light image projected onto the other photo detector 126 and both light images are shown by SPs. FIG. 6 also shows a light amount distribution along a broken line i. Two photo sensitive elements 152 for reproducing recorded information and photo sensitive elements 153a and 153b for tracking control are provided for the photo detector 125. Photo sensitive elements 151a and 151b for focusing control are provided for the other photo detector 126.

In the diagram, the photo sensitive elements 153a and 153b for tracking control are formed in an isosceles triangular shape, respectively, and are located between the two photo sensitive elements 152 for reproducing the recorded information. The triangular photo sensitive elements 153a and 153b are arranged in a manner such that one vertex of one of the elements and one vertex of the other element are made coincident and those elements are point symmetrically arranged with respect to the vertex. In a state in which the tracking control is correctly executed, the center of the image of the track guide 18 is located on the vertex. On the other hand, the photo sensitive elements 151a and 151b for focusing control are formed in a longitudinal rectangular shape which is longer than the light image SPs and are arranged in contact relation with each other. In a state in which the focusing control is correctly performed, the light image SPs is formed on a boundary of the photo sensitive elements 151a and 151b. Further, the two photo sensitive elements 152 for reproducing the recorded information are formed in a rectangular shape and are located in correspondence to the two adjacent information recorded or recording tracks 17. Thus, the recorded information can be simultaneously read out from two tracks.

FIG. 6 shows the image obtained as a result of the light being transmitted through the half-mirror 124. FIG. 7 shows the image obtained as a result of that the light is reflected by the half-mirror 124. Thus, both images are the inverted images with respect to the right and left directions. In the diagram, an arrow indicates a moving direction of the optical card 1.

In order to converge the light from the semiconductor laser 114 onto the optical card 1 and to form the pits 19 by a thermal irreversible change, it is necessary to execute the focusing control so that an error of the relative distance between the objective lens 118 and the optical card 1 lies within a range of, for instance, ±2 μm.

Figure 8:
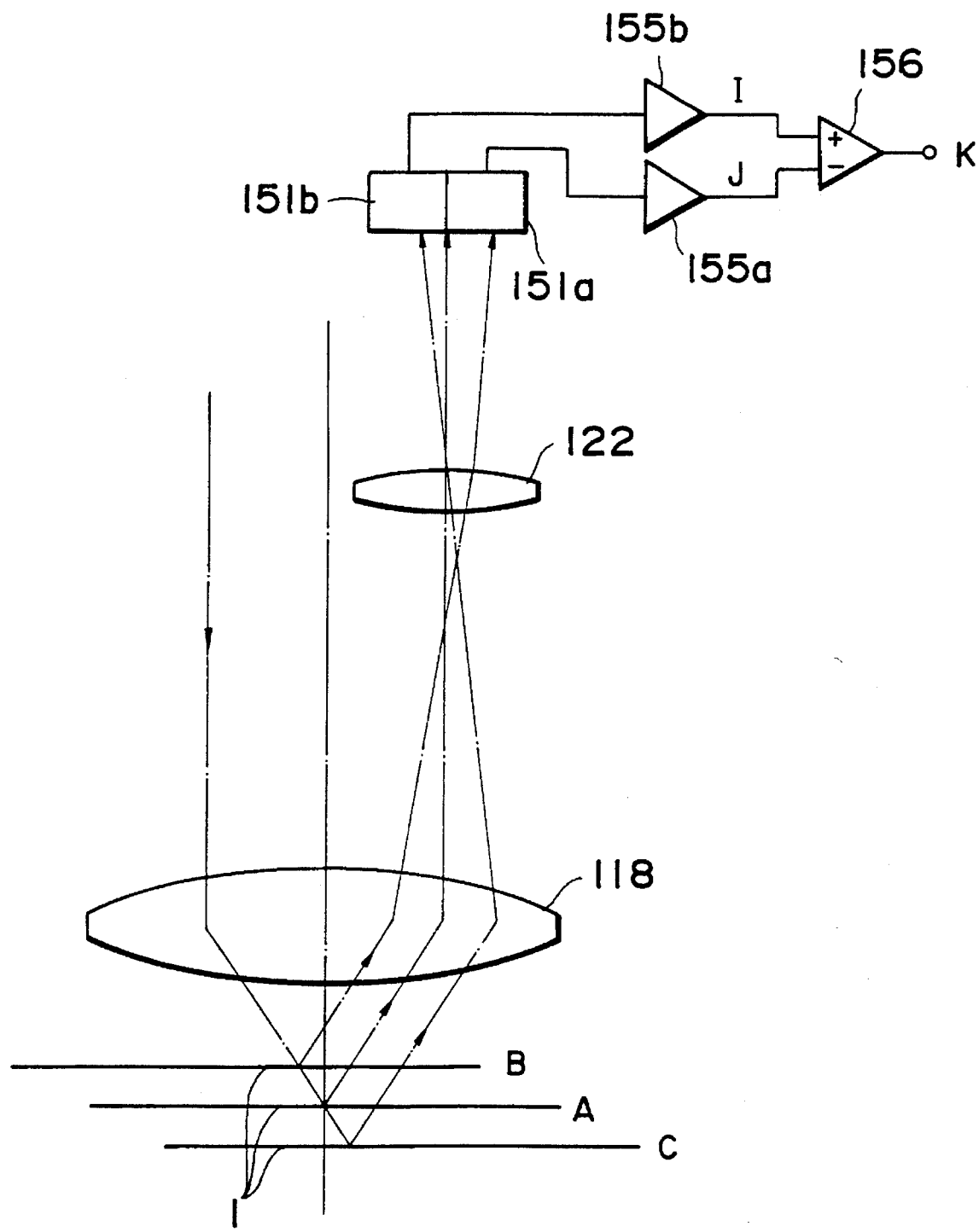
FIG. 8 shows the principle of the focusing control.

FIG. 8 shows the detection principle of a focusing error signal in the focusing control.

The light from the end face light emitting diode 119 passes through the objective lens 118 and is focused to a predetermined position (in-focus position A). When the reflecting surface of the optical card 1 exists at the in-focus position A, the photo sensitive elements 151a and 151b are positioned at the locations where the reflected lights are led by the condenser lens 122 and the lights of the same light amount enter the photo sensitive elements 151a and 151b for focusing control. The in-focus position of the light by the semiconductor laser 114 and the in-focus position of the end face light emitting diode 119 are previously made to substantially coincide upon assembly and adjustment. In FIG. 8, reference numerals 155a and 155b denote amplifiers for amplifying light detection signals of the photo sensitive elements 151a and 151b. Reference numeral 156 indicates a differential amplifier for amplifying a difference between amplified outputs of the amplifiers 155a and 155b.

In FIG. 8, when the reflecting surface of the optical card 1 is deviated to a position B nearer the objective lens 118 rather than the in-focus position A or to a position C farther from the in-focus position A, the light image $SP_s$ projected onto the photo detector 126 by the objective lens 118 also moves on the photo sensitive elements 151a and 151b in association with a change in relative distance between the optical card 1 and the objective lens 118. The light detection signal levels of the photo sensitive elements 151a and 151b differ, so that a differential output K of the differential amplifier 156 is generated and becomes a focusing error signal.

Figure 9:
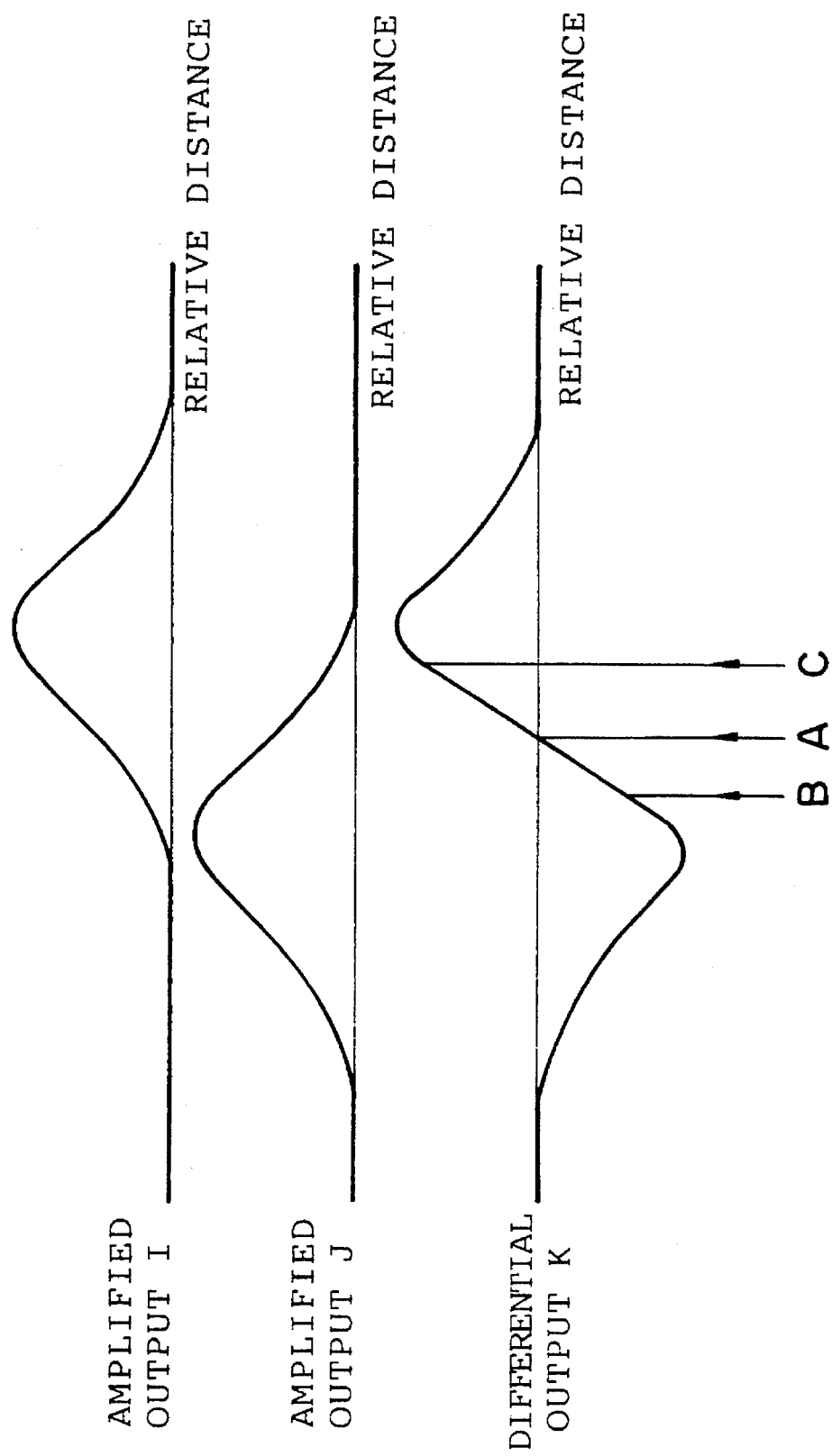
FIG. 9 shows signal waveforms in the focusing control.
Figure 29:
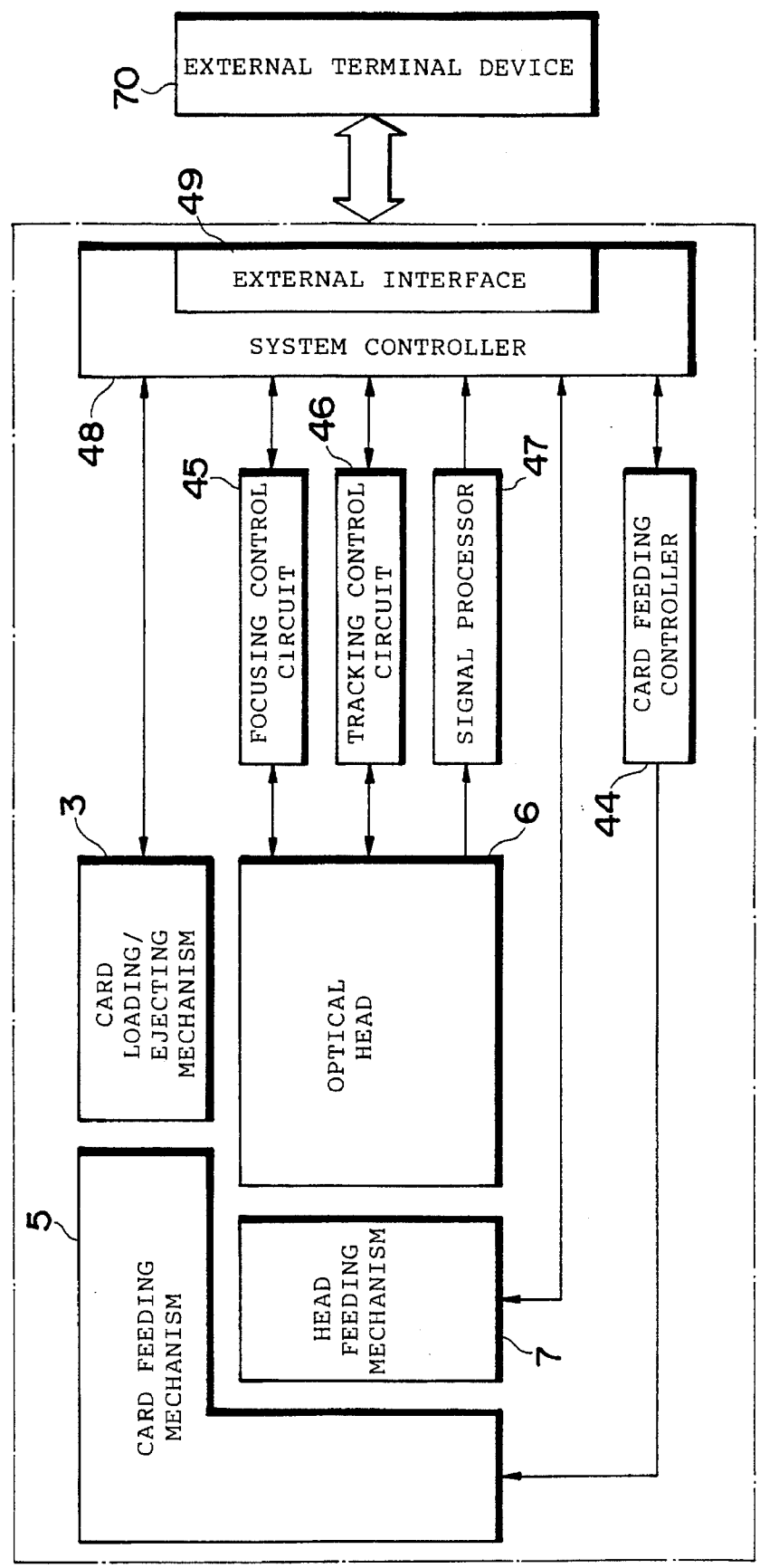

FIG. 9 shows amplifier outputs I and J of the light detection signals of the photo sensitive elements 151a and 151b and the differential output K (focusing error signal) of the differential amplifier 156. When the optical card 1 is deviated from the in-focus position A and the relative distance between the optical card 1 and the objective lens 118 changes, the light image SPs moves on the photo sensitive elements 151a and 151b of the photo detector 126, the outputs of the elements 151a and 151b change, and a focusing error signal whose positive/negative sign is inverted from the in-focus position A as a turning point is produced. From the focusing error signal, the focusing control circuit 45 (shown in FIG. 29) can obtain the information regarding the relative distance between the optical card 1 and the objective lens 118. The focusing control circuit 45 drives a lens driving mechanism (not shown) and adjusts the position of the objective lens 118, thereby executing the automatic focusing control.

Figure 10:
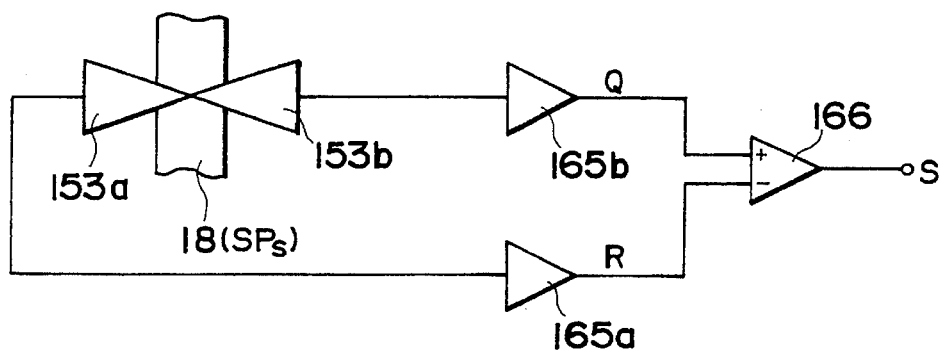
FIG. 10 shows the principle of the tracking control.

FIG. 10 shows the detection principle of a tracking error signal in the tracking control.

Figure 11:
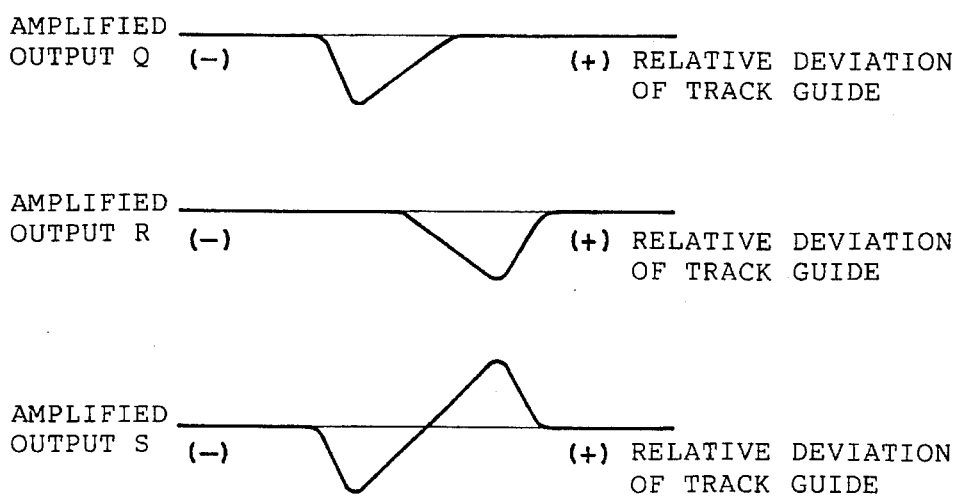
FIG. 11 shows signal waveforms in the tracking control.

In the diagram, output signals of the photo sensitive elements 153a and 153b for tracking control are sent to amplifiers 165a and 165b and are amplified (amplified outputs are shown by R and Q), respectively. Thereafter, the amplified outputs are supplied to a differential amplifier 166. A differential output S of the differential amplifier 166 is used as a tracking error signal. When the tracking control is correctly executed, the center of the image of the track guides 18 in the light image $SP_s$ is accurately located on the same vertex of the photo sensitive elements 153a and 153b for tracking control in the photo detector 125. At this time, the light detection signal levels as outputs of the photo sensitive elements 153a and 153b coincide, so that the differential output S (tracking error signal) is set to zero. If the center of the image of the track guides 18 in the light image SPs is deviated from the correct position, the output signal levels of the photo sensitive elements 153a and 153b change in accordance with the deviating direction (+ or − direction), so that the outputs R and Q of the amplifiers 165a and 165b change as shown in FIG. 11. Therefore, a positive or negative differential output S (tracking error signal) is generated from the differential amplifier 166. On the basis of the tracking error signal, the tracking control circuit 46 (refer to FIG. 29) drives a lens driving mechanism (not shown) and deviates the objective lens 118 in the direction perpendicular to the track guides 18, thereby executing the automatic tracking control.

In a state in which the focusing and tracking control are properly executed, the semiconductor laser 114 is pulse driven by pulse signals which were modulated by information to be recorded while moving the optical card 1. Thus, a pit train is formed onto the information recording tracks 17 on the optical card 1 and the information is recorded.

In this case, since the focusing error signal and tracking error signal are formed by using the light from the end face light emitting diode 119, the focusing and tracking controls can be executed irrespective of the actuation of the semiconductor laser 114. Therefore, even when the semiconductor laser 114 is driven, there is no need to interrupt the focusing and tracking controls and to hold the objective lens 118 to a fixed position and the like. The controls can be easily executed.

On the other hand, although the energy density of the light emitted from the end face light emitting diode 119 is sufficient to execute the focusing and tracking controls and to reproduce the information, it is not so high enough to thermally damage the pits and track guides. Therefore, even if the reproducing operation of information is repeated, there is no fear of deterioration of the pits and track guides.

Figure 12:
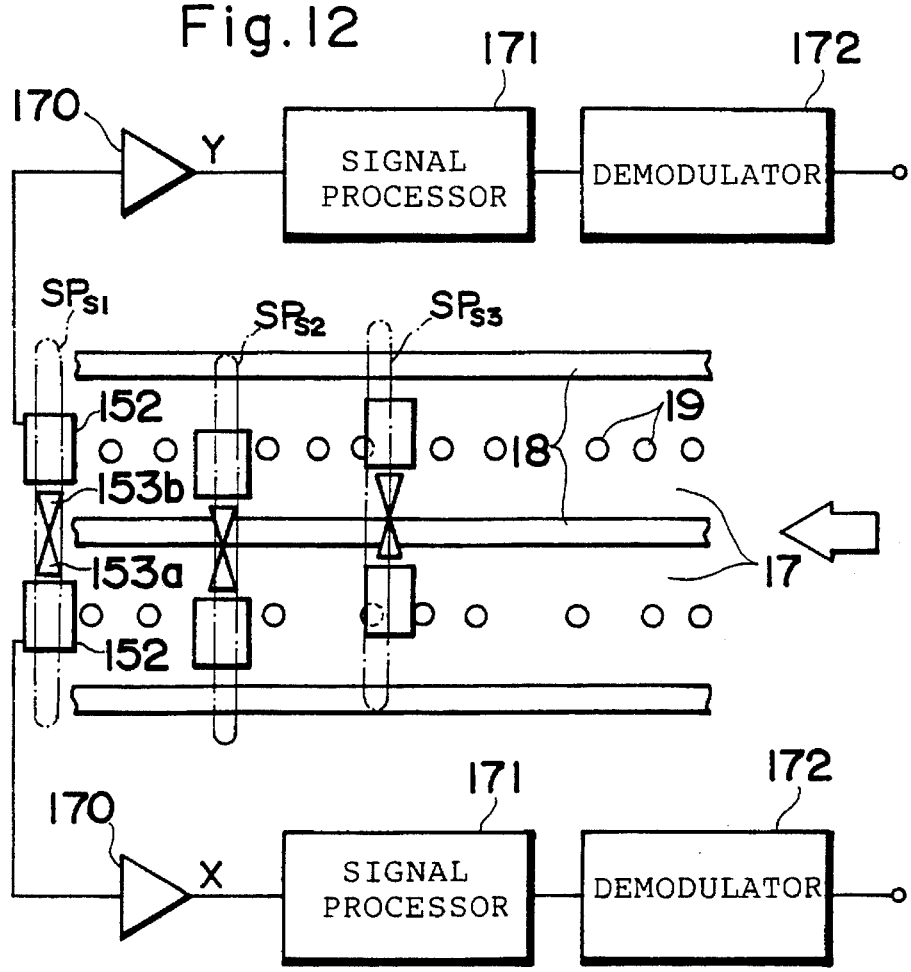
FIG. 12 shows the reproduction principle of recorded information.
Figure 13:
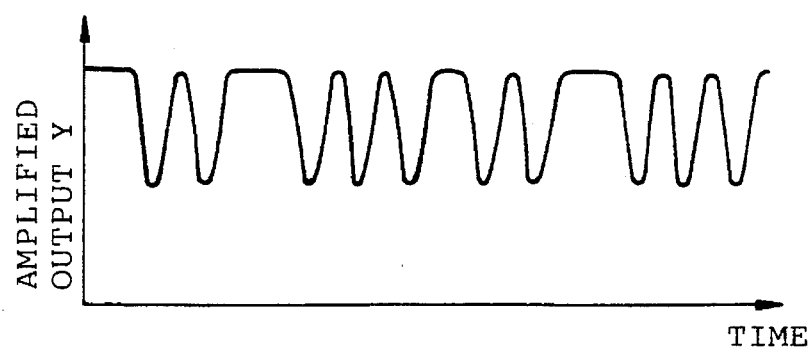
FIG. 13 shows an example of a signal waveform upon reproduction.

FIG. 12 shows the reproducing principle of recorded information. The optical card 1 is moved in the direction indicated by an arrow in the diagram. In a state in which the focusing and tracking controls are properly executed, pit trains on two information recorded tracks are simultaneously scanned by the photo sensitive elements 152 of the photo detector 125. Light detection signals obtained by the photo sensitive elements 152 are respectively amplified by amplifiers 170. Amplified outputs X and Y of the amplifiers 170 (only the signal Y is shown in FIG. 13) are subjected to a waveform shaping process and the like by signal processors 171. After that, the signals are demodulated by demodulators 172 and the recorded information on the optical card 1 is reproduced.

Since the optical card 1 is rectilinearly reciprocated, the self-excited vibration is larger than that in the optical disk in an optical disk drive apparatus or the like. Particularly, when the rectilinear reciprocating motion of the optical card 1 is executed at a high speed in order to satisfy the requirement of the high recording/reproducing speed, such a self-excited vibration further increases. When the self-excited vibration occurs, a disturbance enters the control system. A control deviation occurs in accordance with a magnitude of the disturbance or a gain of the control system and becomes a cause of the focusing error and tracking error.

FIG. 12 shows the relative positional relations between the light images $SP_s$ ($SP_{s1}$ to $SP_{s3}$) by the end face light emitting diode 119 and the photo sensitive elements 152, 153a, and 153b of the photo detector 125. In the diagram, the light image $SP_{s1}$ shows a state in which the relative positional relations are proper. The light images $SP_{s2}$ and $SP_{s3}$ show a position deviated state in which tracking errors were generated, respectively.

However, even if a tracking error occurred, since the light image $SP_s$ has a slit-like shape, the light detection signals are hardly influenced so long as the pits 19 are not deviated out of the photo sensitive elements 152. On the other hand, even if a focusing error occurred, the light amounts which are detected by the photo sensitive elements 152 are also hardly influenced.

Consequently, even if focusing or tracking error occurred, the signal outputs are hardly influenced, so that the recording/reproducing speed can be made high without deteriorating the S/N ratio of the signal.

In the case of the embodiment, on the optical card 1, a reproducing light by the diode 119 traces after a recording light by the semiconductor laser 114. Thus, the recorded information can be reproduced just after the recording and an erroneous recording or the like can be instantaneously found out. Therefore, the writing reliability is extremely high and the system operating time in the recording mode is remarkably reduced.

Figure 14:
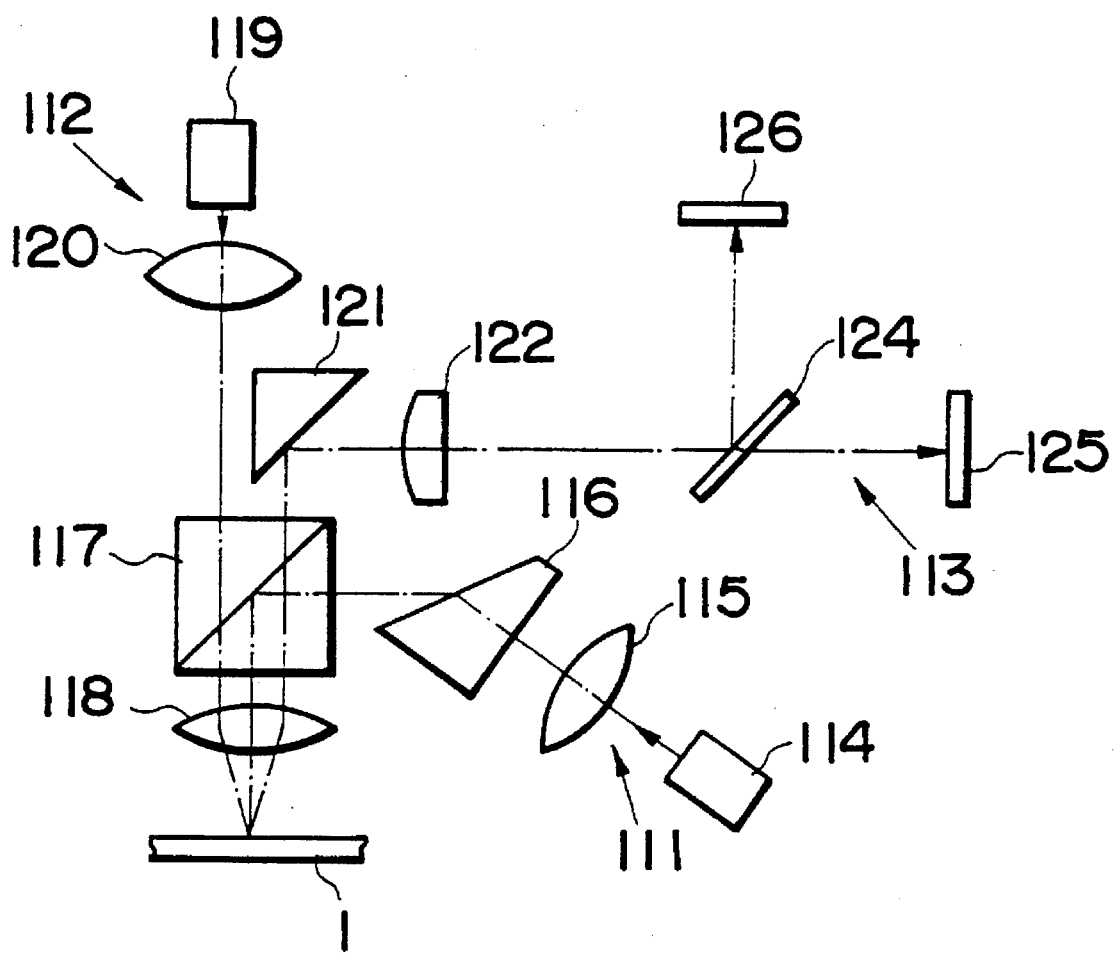
FIG. 14 shows another embodiment of an optical system of an optical head.

In the above embodiments, the optical system of the optical head is not limited to that shown in FIG. 1. For instance, an optical system as shown in FIG. 14 can be also used.

The optical system of the diagram is constructed in the following manner. The first light projection optical system 111 uses the semiconductor laser 114 as a light source and includes the collimating lens 115, warping prism 116, deflecting beam splitter 117, and objective lens 118. The second light projection optical system 112 uses the end face light emitting diode 119 as a light source and includes the collimating lens 120 in addition to the deflecting beam splitter 117 and objective lens 118. Further, light reception optical system 113 includes the reflecting mirror 121, condenser lens 122, half-mirror 124, and photo detectors 125 and 126. The optical system differs from the optical system of FIG. 1 with respect to a point that the parallel beam having an elliptic cross section which is transmitted from the collimating lens 115 is reduced and warped by the warping prism 116. The incident light to the warping prism 116 is reduced only in the major axis direction of the ellipse and is emitted as an almost circular beam. The circular beam is reflected by substantially 100% by the reflecting surface of the deflecting beam splitter 117 because of the characteristics of the semiconductor laser 114 and is led to the objective lens 118.

In this case, an effective value of an NA (numerical aperture) of the objective lens 118 is small. Therefore, although the size of light spot which is converged onto the optical card 1 is large, since a focal depth becomes deep, if a semiconductor laser of a high power can be used, there is an advantage such that even if a focusing error exists, a depth range of a focal point where pits can be formed is widened.

The light emitted from the diode 119 is transformed to the almost parallel beam by the collimating lens 120. Only the P polarization light component of the parallel beam is transmitted through the deflecting beam splitter 117 and is led to the objective lens 118.

The detecting operations and the like by the photo detectors 125 and 126 are similar to those in the embodiment regarding FIG. 1 as mentioned above and their descriptions are omitted here.

Figure 30:
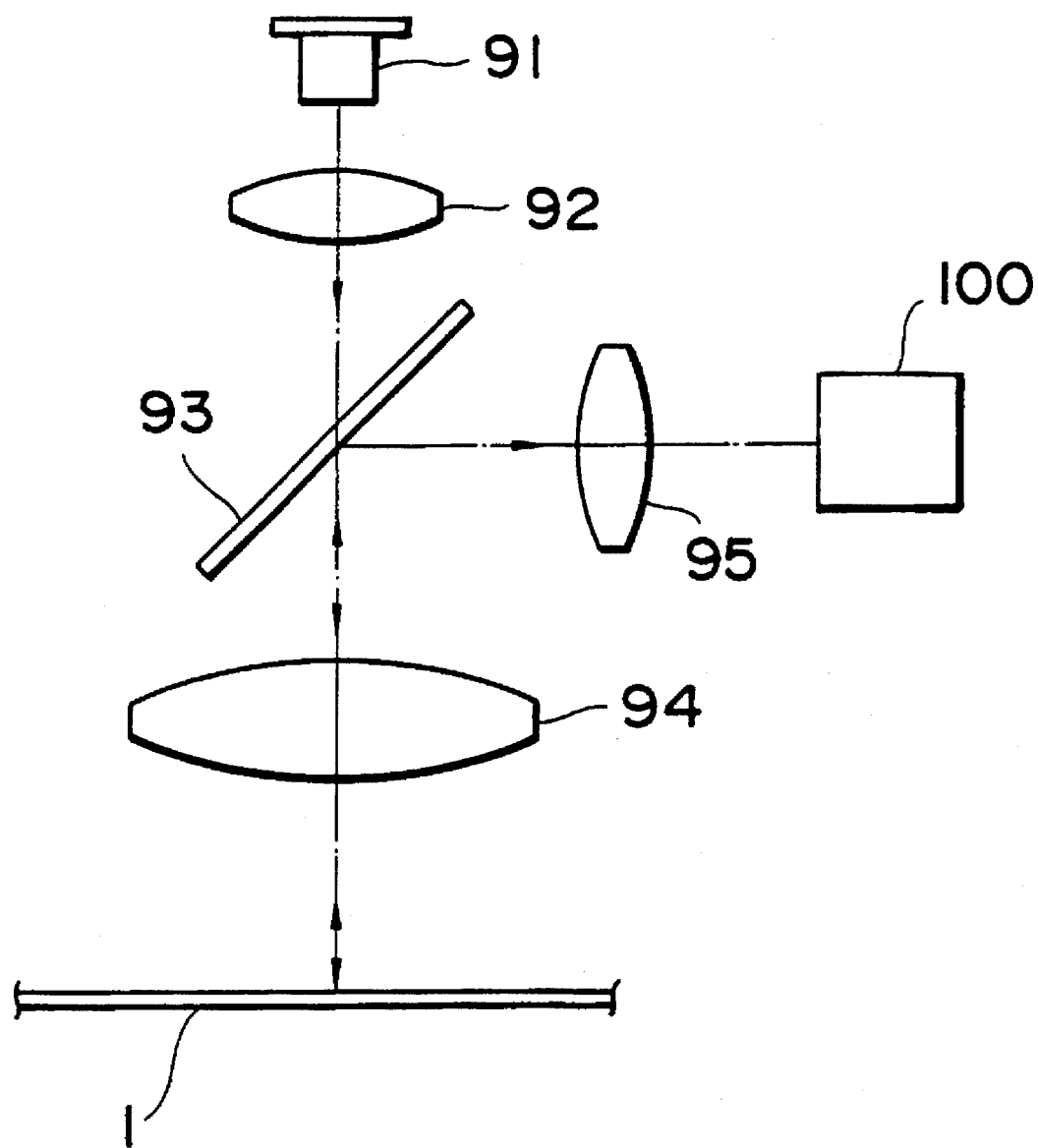
Figure 31:
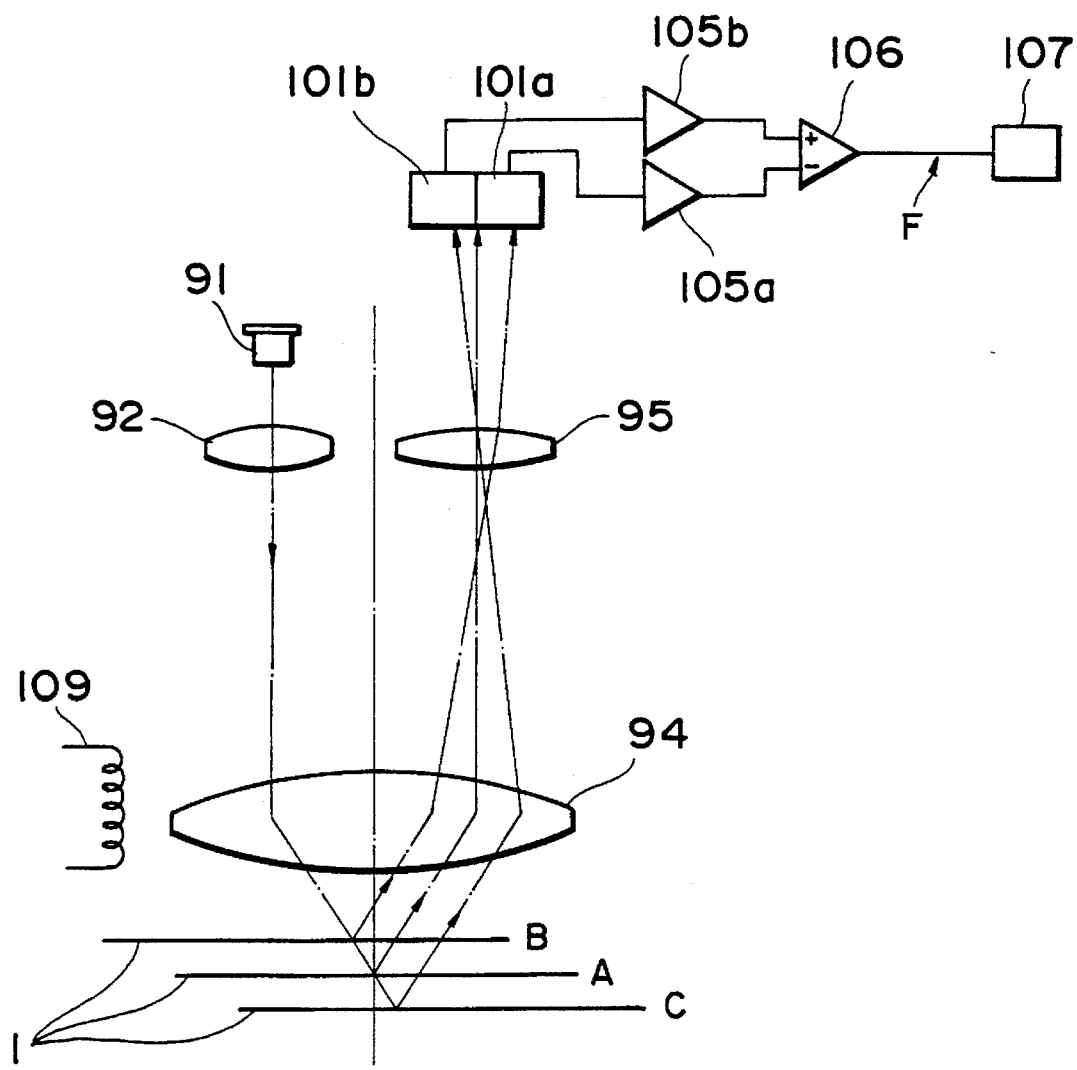

Another embodiment of the invention will now be described in detail. An optical card recording/reproducing apparatus according to another embodiment has an optical head shown in FIG. 30 and a focusing control mechanism shown in FIG. 31. Since its fundamental construction has already been described, its description is omitted.

FIGS. 15a and 15b are diagrams showing the corresponding relations among the optical card, an irradiation light spot (corresponding to a detection light spot in photo sensitive elements) which is irradiated onto the optical card, and photo sensitive elements for focusing control.

In the invention, a width W of photo sensitive elements 181a and 181b for focusing control in the direction perpendicular to the track guides 18 on the optical card is set to a length which is integer times as long as a pitch P of the track guides 18 on the optical card in the detection light spot SP which is obtained by the photo sensitive elements for focusing control. In the embodiment, the width W is twice as long as the pitch P.

Figure 32:
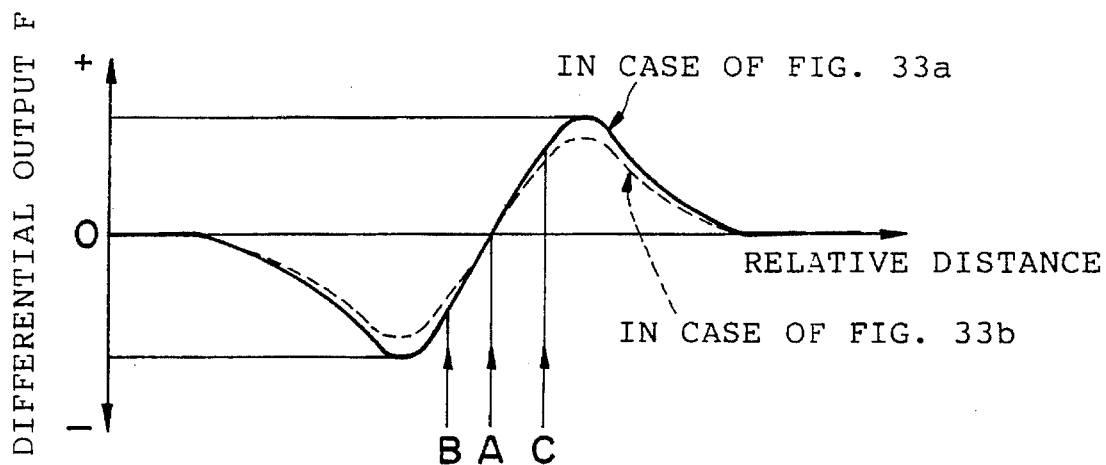
Figures 33A, 33B:
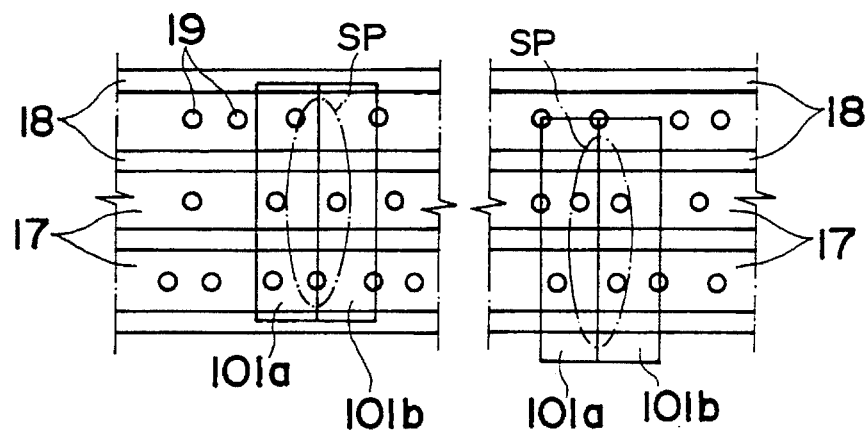
FIGS. 33a to 33b are diagrams corresponding to FIGS. 15a and 15b, respectively.

With such a construction, even in the case where the irradiation light spot SP faces three track guides 18 as shown in FIG. 33b, the substantial width dimension of the track guides 18 which face the irradiation light spot SP is set to a value corresponding to two track guides 18 in a manner similar to the case where the irradiation light spot S faces two track guides 18 as shown in FIG. 33a. That is, even when the irradiation light spot SP exists at any position on the optical card in the direction perpendicular to the track guides 18 (at any position in FIG. 15a, at any position in FIG. 15b), a reduction amount of the reflected light amount based on the existence of the track guides 18 in light detected amounts of the photo sensitive elements 181a and 181b for focusing control is set to be always constant. Thus, the differential output F is stably obtained as shown by a solid line in a graph of FIG. 32.

In the above embodiment, the width W of the photo sensitive elements for focusing control has been set to a value which is twice as long as the pitch P of the track guides in the detection light spot. However, the width W can be also properly set to a value which is three time, four time, or the like as long as the pitch P.

On the other hand, as a method of determining the width W of the photo sensitive elements for focusing control, in addition to a method whereby photo sensitive elements for focusing control having a width W are used, it is also possible to use a method whereby a mask having a window of a width W is placed on the detecting surface of the photo sensitive elements for focusing control which are commercially available.

Further another embodiment of the invention will now be described in detail. An optical card recording/reproducing apparatus according to the embodiment has the optical head shown in FIG. 30 and the focusing control mechanism shown in FIG. 31. Since its fundamental construction has already been described, its description is omitted here.

Figure 16A:
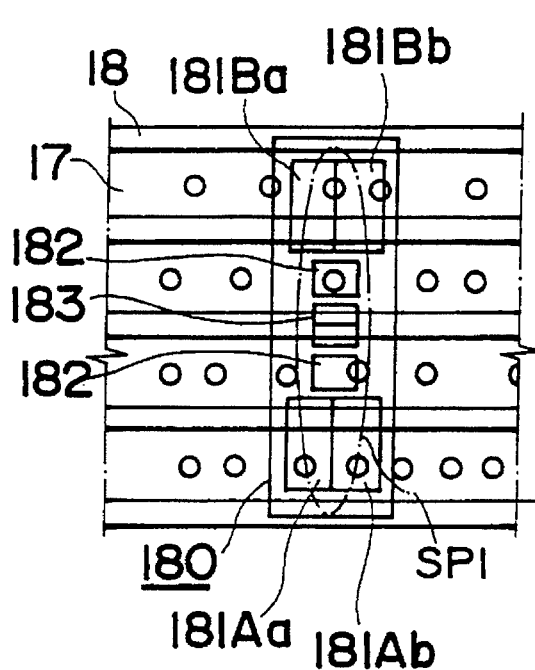
FIGS. 16a and 16b relate still another embodiment of the invention and are diagrams showing the corresponding relations among each photo sensitive element of a photo detector, a detection light spot (irradiation light spot corresponding to the detection light spot) which is obtained by the photo detector, and an optical card.
Figure 16B:
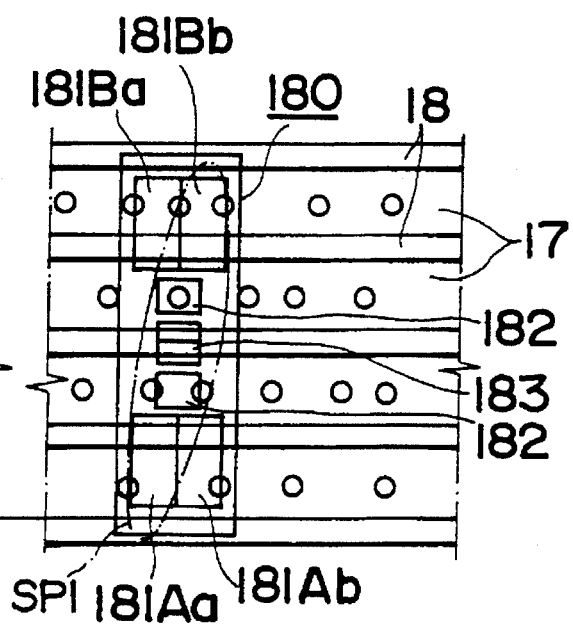
Figures 34A, 34B:
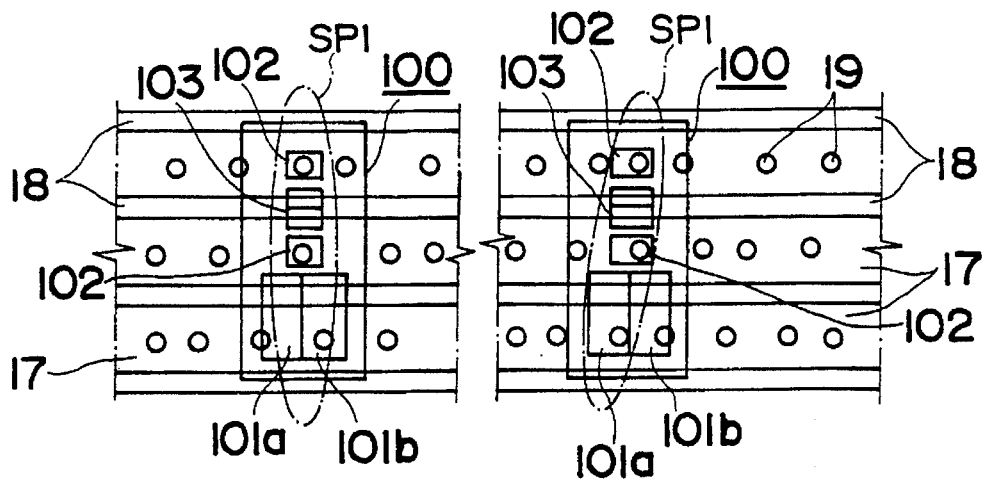
FIGS. 34a and 34b are diagrams corresponding to FIGS. 16a and 16b, respectively.

FIGS. 16a and 16b are diagrams showing the corresponding relations among photo sensitive elements of a photo detector, a detection light spot (the same as an irradiation light spot on the optical card) which is obtained by the detector, and the optical card. It is requested to compare with FIGS. 34a and 34b, which have already been described.

According to the invention, a photo detector 180 uses two split-type photo sensitive elements for focusing control. Those elements are arranged at both outside positions of photo sensitive elements 182 for recording/reproducing, respectively. That is, one split-type photo sensitive element for focusing control comprises photo sensitive elements 181Aa and 181Ab. The other split-type photo sensitive element for focusing control comprises photo sensitive elements 181Ba and 181Bb. A photo sensitive element 183 for tracking control is arranged at the center of the photo detector 180. The photo sensitive elements 182 for recording/reproducing are arranged on both sides of the element 183. The photo sensitive elements 181Aa, 181Ab, 181Ba, and 181Bb for focusing control are further arranged on both sides of the elements 182.

The sum of light detection signals of the photo sensitive elements 181Aa and 181Ba for focusing control is calculated. The sum of light detection signals of the photo sensitive elements 181Ab and 181Bb for focusing control is calculated. Signals indicative of the sums are input to the differential amplifier. A differential signal indicative of the difference between the sums is output from the differential amplifier and is used as a focusing error signal.

In FIG. 16a, in a state in which the focusing control is properly executed, the light detected amounts of the photo sensitive elements 181Aa and 181Ab are equal and the light detected amounts of the photo sensitive elements 181Ba and 181Bb are also equal. Thus, the sum of the light detection signals of the elements 181Aa and 181Ba and the sum of the light detection signals of the elements 181Ab and 181Bb are equal and the differential output is set to zero.

As shown in FIG. 16b, even if the detection light spot SP1 is inclined for the detector 180, when the focusing control is correctly executed, the sum of the light detection signals of the elements 181Aa and 181Ba and the sum of the light detection signals of the elements 181Ab and 181Bb are equal. Therefore, the differential output is also set to zero. As mentioned above, even when the detection light spot SP1 is obliquely formed onto the detector 180, the focusing control can be correctly performed without any trouble.

Further another embodiment of the invention will be described in detail. In an optical card recording/reproducing apparatus regarding the embodiment, various signal processors and the like are integrally constructed in the optical head shown in FIG. 30. Since its fundamental construction has already been described, its description is omitted.

Figure 17A:
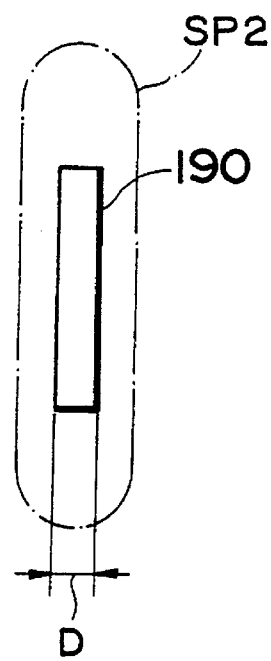
Figure 17B:
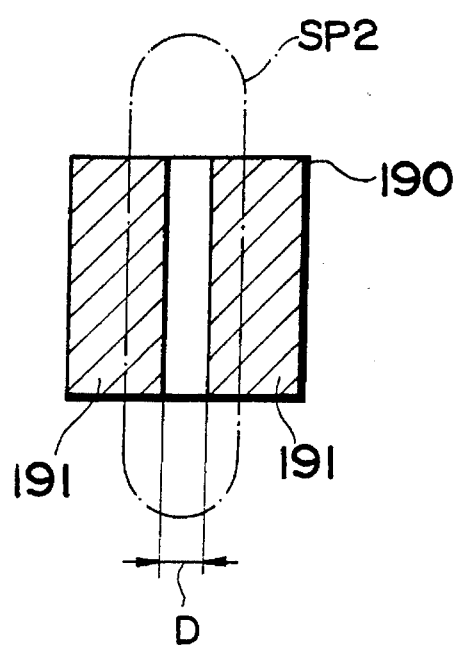

FIGS. 17a and 17b are front views showing detecting surfaces of recording/reproducing photo sensitive elements 190 as characteristic parts of the embodiment, respectively.

In FIG. 17a, the element 190 of a narrow width is used. The width is smaller than a width of detection light spot SP2. That is, the width is set to a width D which is equal to or smaller than the minimum arrangement interval of information pits on the track of the optical card in the detection light spot SP2 on the recording/reproducing photo sensitive element 190.

In FIG. 17b, a conventional element is used as a recording/reproducing photo sensitive element 190. By providing masks 191 on both sides of the detecting surface, the detection width is set to D. With such a construction using the masks 191, a commercially available photo sensitive element can be used.

Figure 18:
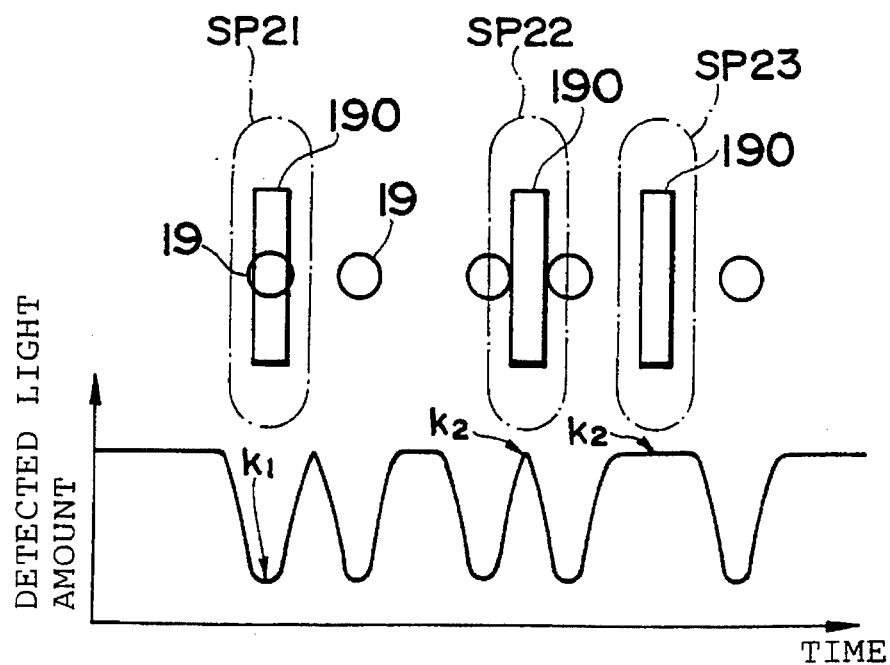
Figure 19:
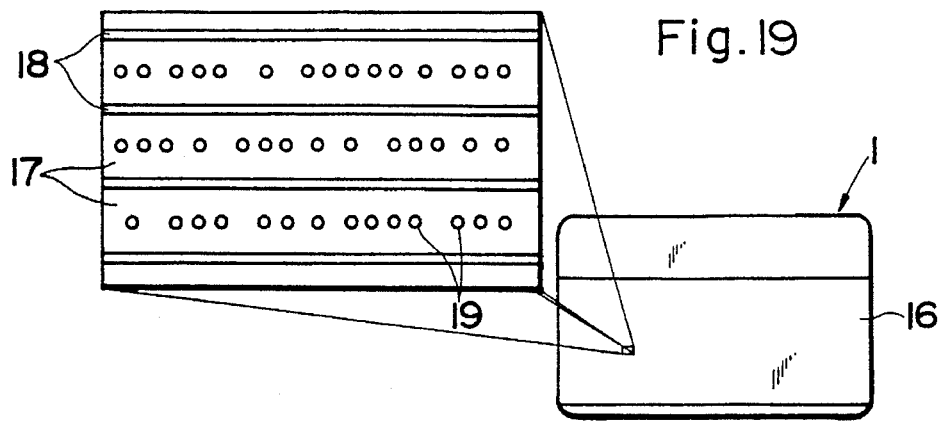
Figure 20:
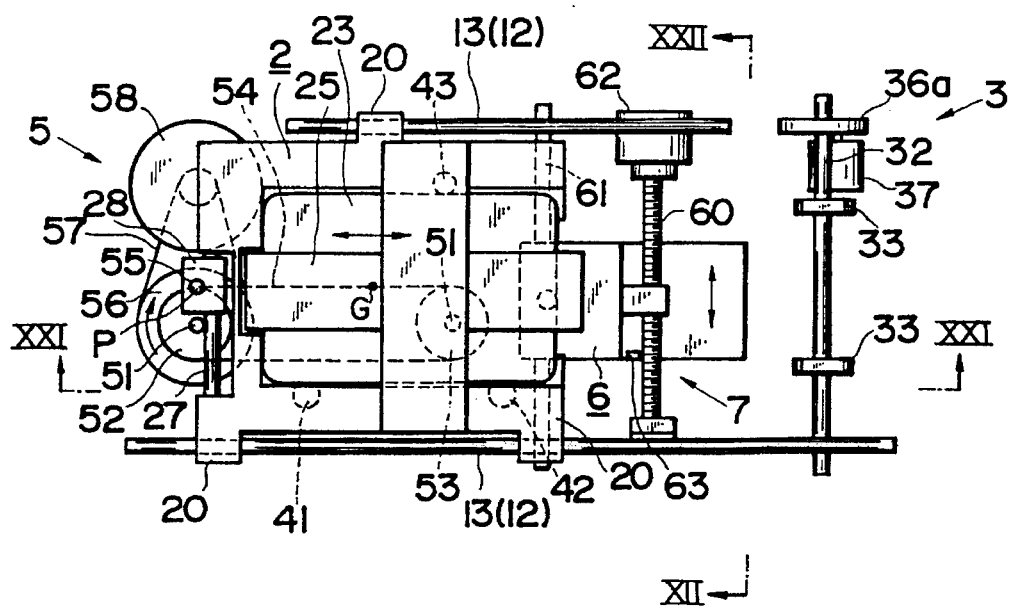
Figure 21:
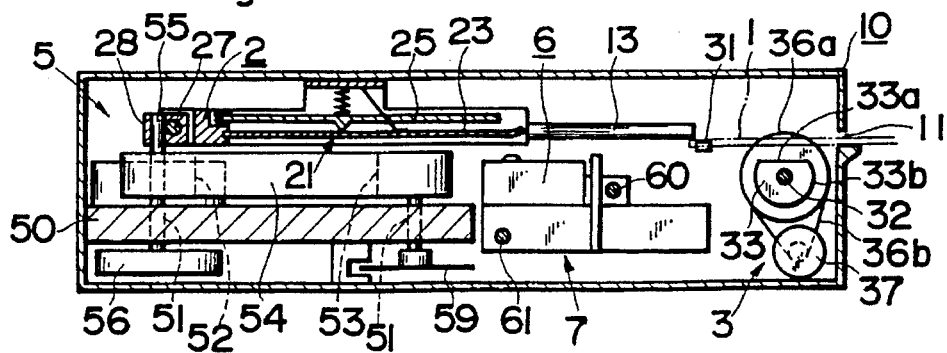
Figure 22:
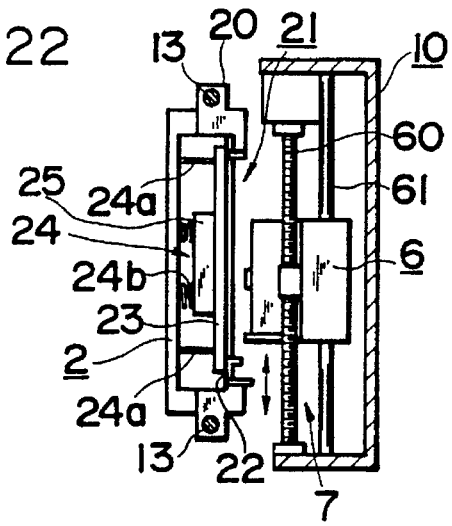
Figure 23:
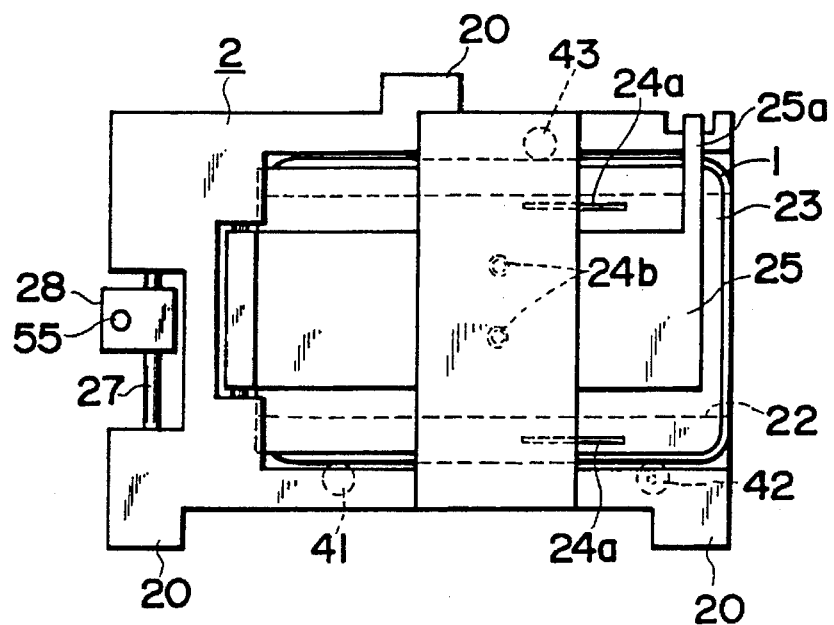
Figure 24:
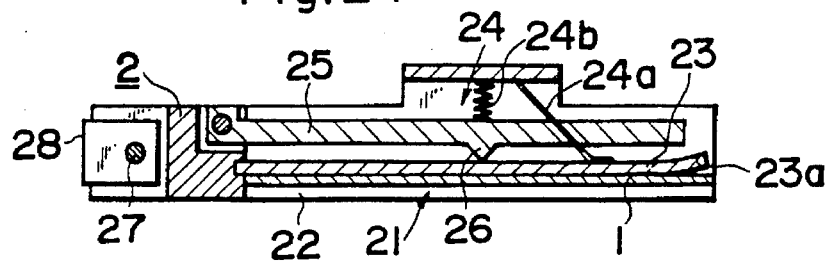
Figure 27:
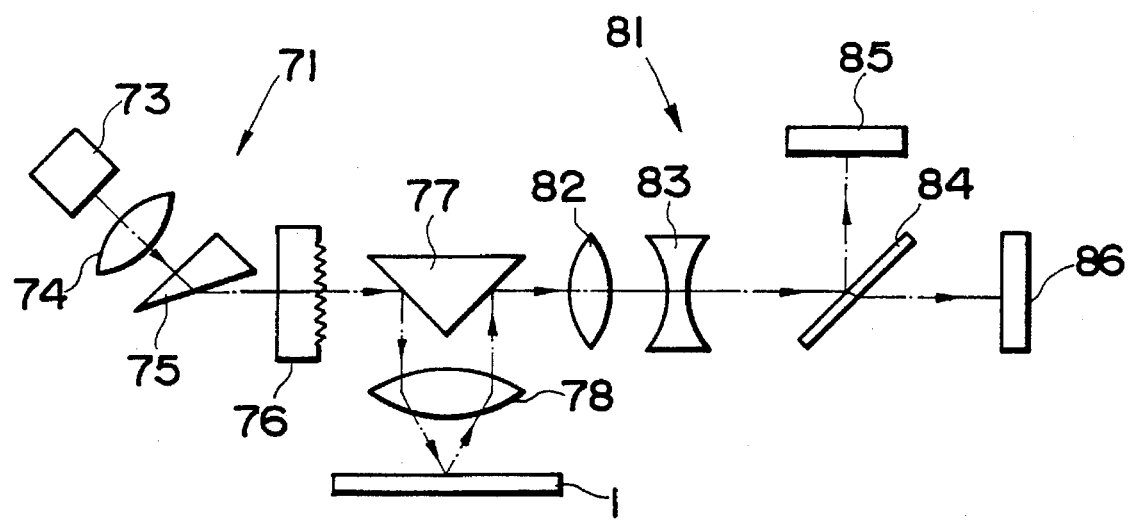
Figure 28:
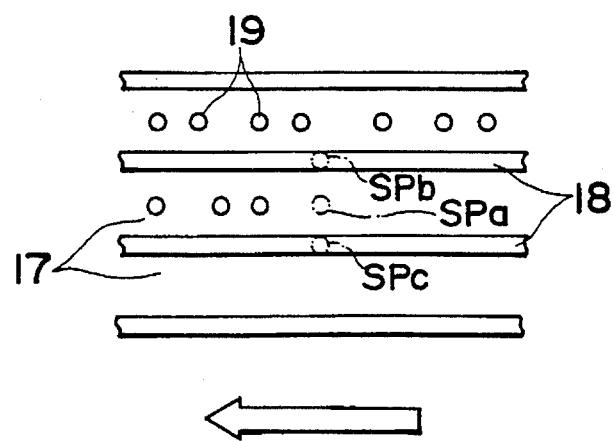

The light detecting operation of the recording/reproducing photo sensitive element 190 shown in FIG. 17a will now be described with reference to FIG. 18.

In the case where an irradiation light spot SP21 exists at the position where the center of the irradiation light spot coincides with the center of the information pit 19, the reflected light amount is minimum. Therefore, an output of the photo sensitive element 190 is set to the minimum light amount $k_1$. On the other hand, when an irradiation light spot SP23 exists at the position where no information pit 19 is recorded, the reflected light amount is maximum and the output of the element 190 is set to the maximum light amount $k_2$.

Figure 35:
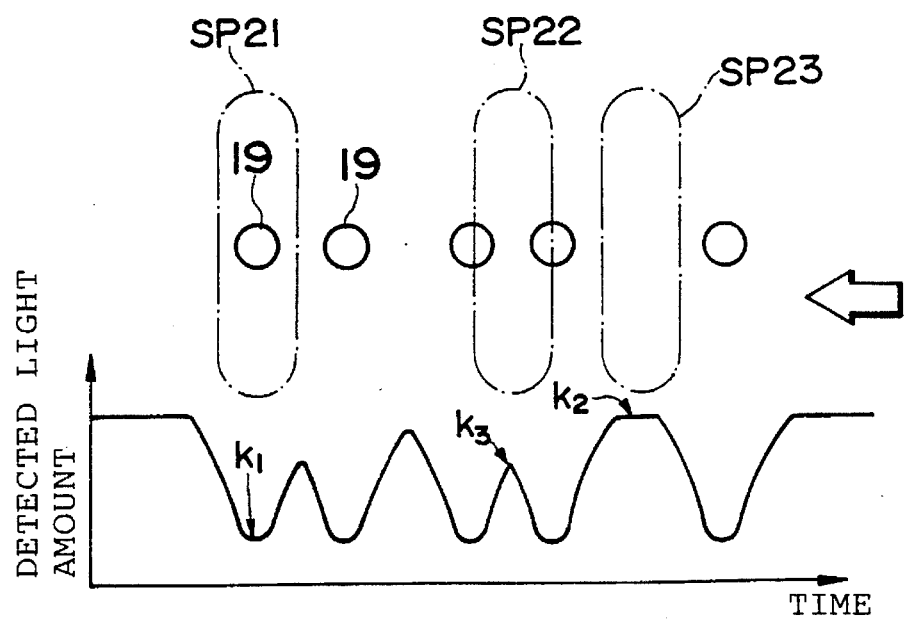

When the irradiation light spot SP22 exists at the position where the center of the irradiation light spot coincides with the intermediate position of two information pits 19 which are neighboring at the minimum arrangement interval, the both side portions of the light spot SP22 are projected onto the two information pits 19. However, since the width D of the recording/reproducing photo sensitive element 190 has been set as mentioned above, the reflected lights from the pits 19 are not detected by the element 190, so that the detected light amount is set to $k_2$ in a manner similar to the case of the light spot SP23. It is requested to compare with FIG. 35.

Consequently, the detected light amount can be accurately obtained in correspondence to the presence or absence of the information pits 19.

Even in the embodiment shown in FIG. 17b, the detecting operation is executed in a manner similar to the FIG. 17a.

What is claimed is:

1. An optical card recording/reproducing apparatus for recording/reproducing information onto/from an optical card formed with a plurality of track guides which are arranged in parallel with each other with a predetermined pitch, comprising:

a light source for emitting light;

a photo detector including a photo sensitive element for focusing control; and an optical system for converging said light emitted from said light source onto said optical card and for forming an image of reflected light onto said photo detector, the image including an image of said track guides of said optical card;

wherein said photo sensitive element has a detection area, and a width of said detection area in the direction perpendicular to said track guides is set to a length equal to an integer times a pitch of said track guides in said image formed on said photo detector, wherein said integer is greater than or equal to two.

2. An optical card recording/reproducing apparatus for recording/reproducing information onto/from an optical card formed with a plurality of track guides which are arranged in parallel with each other with a predetermined pitch, comprising:

a light source for emitting light;

a photo detector including a photo sensitive element for focusing control;

an optical system for converging said light emitted from said light source onto said optical card and for forming an image of reflected light onto said photo detector, the image including an image of said track guides of said optical card;

wherein said photo sensitive element has a detection area, and a width of said detection area in the direction perpendicular to said track guides is set to a length equal to an integer times a pitch of said track guides in said image formed on said photo detector, wherein said integer is greater than or equal to two, and a mask provided on said photo sensitive element formed with a window defining said detection area.

3. An optical card recording/reproducing apparatus for recording/reproducing information onto/from an optical card having a plurality of tracks provided thereon, comprising:

a light source for emitting light;

a photo detector for focusing control comprising a first pair of front and rear photo sensitive elements and a second pair of front and rear photo sensitive elements, said two pairs of photo sensitive elements being arranged apart from each other at a predetermined distance in a direction perpendicular to the direction of said tracks on said optical card and said front and rear photo sensitive elements of each said pair being arranged adjacent to each other along the direction of said tracks and said optical card, said photo detector further comprising a plurality of recorded information reproducing photo sensitive elements, said plurality of recorded information reproducing photo sensitive elements being positioned at the intermediate position of said first and second pairs of photo sensitive elements for focusing control;

first means for adding light detection signals output from said front photo sensitive elements;

second means for adding light detection signals output from said rear photo sensitive elements; and third means for calculating a difference between outputs of said first and second means to produce a focusing error signal.

4. An optical card recording/reproducing apparatus for recording/reproducing information onto/from an optical card formed with a plurality of track guides which are arranged in parallel with each other with a predetermined pitch, comprising:

a light source for emitting light;

a photo detector including a photo sensitive element for focusing control; and an optical system for converging said light emitted from said light source onto said optical card and for forming an image of reflected light onto said photo detector, the image including an image of said track guides of said optical card;

wherein said photo sensitive element has a detection area, and a width of said detection area in the direction perpendicular to said track guides is set to a length equal to an integer times a pitch of said track guides in said image formed on said photo detector, wherein said integer is greater than or equal to two, and wherein said photo sensitive element is divided into two parts by a division line that extends in a direction perpendicular to said plurality of track guides.

5. An optical card recording/reproducing apparatus for recording/reproducing information onto/from an optical card formed with tracks thereon and with a series of pits representing the information arranged along and within each of said tracks, comprising:

a light source for emitting light;

a photo detector including a photo sensitive element for reproducing the information;

a mask provided on said photo sensitive element; and an optical system for converting the light emitted from said light source onto said optical card and for forming an image of the reflected light onto said photo detector, the image including an image of the pits of the optical card;

wherein said photo sensitive element has a detection area, and a width of said detection area in the direction along the tracks is smaller than a minimum distance interval between said pits in said image formed on said photo detector, and said mask provided on said photo sensitive element forms a window defining said detection area.

* * * * *